US011189344B2

(12) United States Patent
Ciprut et al.

(10) Patent No.: US 11,189,344 B2
(45) Date of Patent: Nov. 30, 2021

(54) ENERGY EFFICIENT WRITE SCHEME FOR NON-VOLATILE RESISTIVE CROSSBAR ARRAYS WITH SELECTORS

(71) Applicants: Albert Ciprut, Rochester, NY (US); Eby G. Friedman, Rochester, NY (US)

(72) Inventors: Albert Ciprut, Rochester, NY (US); Eby G. Friedman, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 16/954,643

(22) PCT Filed: Jan. 30, 2018

(86) PCT No.: PCT/US2018/015901
§ 371 (c)(1),
(2) Date: Jun. 17, 2020

(87) PCT Pub. No.: WO2019/125507
PCT Pub. Date: Jun. 27, 2019

(65) Prior Publication Data
US 2020/0312408 A1 Oct. 1, 2020

Related U.S. Application Data

(60) Provisional application No. 62/608,055, filed on Dec. 20, 2017.

(51) Int. Cl.
*G11C 11/00* (2006.01)
*G11C 13/00* (2006.01)

(52) U.S. Cl.
CPC ........ *G11C 13/0069* (2013.01); *G11C 13/003* (2013.01); *G11C 13/004* (2013.01); *G11C 13/0038* (2013.01); *G11C 13/0026* (2013.01); *G11C 13/0028* (2013.01); *G11C 2013/0076* (2013.01)

(58) Field of Classification Search
CPC .............. G11C 13/0069; G11C 13/003; G11C 13/0038; G11C 13/004
USPC .......................................................... 365/148
See application file for complete search history.

(56) References Cited

U.S. PATENT DOCUMENTS 9,785,161 B2 10/2017 Vaisband et al.
2015/0023093 A1* 1/2015 Schneider ........... G11C 11/1675 365/158

OTHER PUBLICATIONS

Aluguri, R., et al., "Overview of Selector Devices for 3-D Stackable Cross Point RRAM Arrays," IEEE Journal of the Electron Devices Society, vol. 4, No. 5, pp. 294-306, Sep. 2016.

(Continued)

*Primary Examiner* — Vu A Le
(74) *Attorney, Agent, or Firm* — Harris Beach PLLC

(57) ABSTRACT

A method to adaptively and dynamically set a bias scheme of a crossbar array for a write operation includes: performing a read-before-write operation to determine a number of cells n to be written during a write operation; comparing n to a predetermined threshold value to determine an efficient bias scheme; setting at least one voltage regulator to provide a bias voltage according to the efficient bias scheme; and performing the write operation. A method to determine threshold value to determine an efficient bias scheme of a crossbar array and an energy efficient crossbar array device are also described.

19 Claims, 17 Drawing Sheets

(56) References Cited

OTHER PUBLICATIONS

Chen, A.,"A Review of Emerging Non-Volatile Memory (NVM) Technologies and Applications," *Solid-State Electronics*, vol. 125, pp. 25-38, Nov. 2016.
Chen, S. Yu and P.-Y., "Emerging Memory Technologies: Recent Trends and Prospects," IEEE Solid-State Circuits Magazine, vol. 8, No. 2, pp. 43-56, Jun. 2016.
Chen, Y.-C., et al., "An Access-Transistor-Free (OT/1R) Non-Volatile Resistance Random Access Memory (RRAM) Using a Novel Threshold Switching, Self-Rectifying Chalcogenide Device," *Proceedings of the IEEE International Electron Devices Meeting*, pp. 4-37, Dec. 2003.
Choi, B. J., et al., "Trilayer Tunnel Selectors for Memristor Memory Cells," Advanced Materials, vol. 28, No. 2, pp. 356-362, Jan. 2016.
Ciprut, A., et al., "Modeling Size Limitations of Resistive Crossbar Array With Cell Selectors," IEEE Transactions on Very Large Scale Integration Systems, vol. 25, No. 1, pp. 286-293, Jan. 2017.
Ciprut, A., et al., "On the Write Energy of Non-Volatile Resistive Crossbar Arrays With Selectors," Proceedings of the IEEE International Symposium on Quality Electronic Design, Mar. 2018 (in submission).
Cong, X., et al., "Overcoming the Challenges of Crossbar Resistive Memory Architectures," Proceedings of the IEEE International Symposium on High Performance Computer Architecture, pp. 476-488, Feb. 2015.
Farkhani, H., et al., "STT-RAM Energy Reduction Using Self-Referenced Differential Write Termination Technique," IEEE Transactions on Very Large Scale Integration Systems, vol. 25, No. 2, pp. 476-487, Feb. 2017.
Huang, J.-J., et al., "Bipolar Nonlinear Ni/TiO2/Ni Selector for 1S1R Crossbar Array Applications," IEEE Electron Device Letters, vol. 32, No. 10, pp. 1427-1429, Oct. 2011.
Huang, J.-J., et al., "One Selector-One Resistor (1S1R) Crossbar Array for High-Density Flexible Memory Applications," Proceedings of the IEEE International Electron Device Meeting, p. 31.7.1-31.7.4, Dec. 2011.
Ishii, T., et al., "Adaptive Comparator Bias-Current Control of 0.6 V Input Boost Converter for ReRAM Program Voltages in Low Power Embedded Applications," IEEE Journal of Solid-State Circuits, vol. 51, No. 10, pp. 2389-2397, Oct. 2016.
Kose, S., et al., "Distributed On-Chip Power Delivery," IEEE Journal on Emerging and Selected Topics in Circuits and Systems, vol. 2, No. 4, pp. 704-713, Dec. 2012.
Kvatinsky, S., et al., "Memristor-Based Material Implication (IMPLY) Logic: Design Principles and Methodologies," IEEE Transactions on Very Large Scale Integration Systems, vol. 22, No. 10, pp. 2054-2066, Oct. 2014.
Kvatinsky, S., et al., "Vteam: A General Model for Voltage-Controlled Memristors," IEEE Transactions on Circuits and Systems II: Express Briefs, vol. 62, No. 8, pp. 786-790, Aug. 2015.
Lee, W., et al., "High Current Density and Nonlinearity Combination of Selection Device Based on TaOx/TiO2/TaOx Structure for One Selector One Resistor Arrays," ACS Nano, vol. 6, No. 9, pp. 8166-8172, Aug. 2012.
Lin, C.-Y., et al., "Attaining Resistive Switching Characteristics and Selector Properties By Varying Forming Polarities In A Single HfO2-Based RRAM Device With A Vanadium Electrode," Nanoscale, vol. 9, pp. 8586-8590, May 2017.
Lung, H. L., "Method, Apparatus and Computer Program Product for Read Before Programming Process on Multiple Programmable Resistive Memory Cell," U.S. Pat. No. 7,433,226, Oct. 7, 2008.
Luo, Q., et al., "Demonstration of 3D Vertical RRAM with Ultra Low-Leakage, High-Selectivity and Self-Compliance Memory Cells," Proceedings of the IEEE International Electron Device Meeting, p. 10.2.1-10.2.4, Dec. 2015.
Luo, Q., et al., "Super Non-Linear RRAM With Ultra-Low Power for 3D Vertical Nano-Crossbar Arrays," Nanoscale, vol. 8, p. 15629-15636, Jul. 2016.
Midya, R., et al., "Anatomy of Ag/Hafnia-Based Selectors with 1010 Nonlinearity," Advanced Materials, vol. 29, No. 12, pp. 1-8, Jan. 2017.
Na, T., et al., "Offset-Canceling Current-Sampling Sense Amplifier for Resistive Nonvolatile Memory in 65 nm CMOS," IEEE Journal of Solid-State Circuits, vol. 52, No. 2, pp. 496-504, Feb. 2017.
Song, B., et al., "Exploration of Selector Characteristic Based On Electron Tunneling for RRAM Array Application," IEICE Electronics Express, vol. 14, No. 17, pp. 1-8, Aug. 2017.
Srinivasan, V., et al., "A Floating-Gate-Based Programmable CMOS Reference," IEEE Transactions on Circuits and Systems I: Regular Papers, vol. 55, No. 11, pp. 3448-3456, Dec. 2008.
Strukov, D. B et al., "The Missing Memristor Found," Nature, vol. 453, No. 7191, pp. 80-83, May 2008.
Toprak-Deniz, Z., et al., "Distributed System of Digitally Controlled Microregulators Enabling Per-Core DVFS for the POWER8TM Microprocessor," Proceedings of the IEEE International Solid-State Circuits Conference, pp. 98-99, Feb. 2014.
Torres, J., et al., "Low Drop-Out Voltage Regulators: Capacitor-Less Architecture Comparison," IEEE Circuits and Systems Magazine, vol. 14, No. 2, pp. 6-26, May 2014.
Vaisband, I., et al., "Heterogeneous Methodology for Energy Efficient Distribution of On-Chip Power Supplies," IEEE Transactions on Power Electronics, vol. 28, No. 9, pp. 4267-4280, Sep. 2013.
Villar-Pique, G., et al., "Survey and Benchmark of Fully Integrated Switching Power Converters: Switched-Capacitor Versus Inductive Approach," IEEE Transactions on Very Large Scale Integration Systems, vol. 28, No. 9, pp. 4156-4167, Sep. 2013.
Wang, M., et al., "Conduction Mechanism of a TaOx-Based Selector and its Application in Crossbar Memory Arrays," Nanoscale, vol. 7, No. 11, pp. 4964-4970, Feb. 2015.
Wong, H. S. P., et al., "Phase Change Memory," Proceedings of the IEEE, vol. 98, No. 12, pp. 2201-2227, Oct. 2010.
Wong, H. S. P., et al., "Metal-Oxide RRAM," Proceedings of the IEEE, vol. 100, No. 6, pp. 1951-1970, May 2012.
Wu, Y.-C., et al., "A Low Dropout Voltage Regulator with Programmable Output," Proceedings of the IEEE Conference on Industrial Electronics and Applications, pp. 3357-3361, Jun. 2009.
Xiangyu, D., et al., "NVSim: A Circuit-Level Performance, Energy, and Area Model for Emerging Nonvolatile Memory," IEEE Transactions on Computer-Aided Design of Integrated Circuits and Systems, vol. 31, No. 7, pp. 994-1007, Jul. 2012.
Yong, C., et al., "Nanoscale Molecular-Switch Crossbar Circuits," Nanotechnology, vol. 14, No. 4, pp. 462-468, Mar. 2003.

* cited by examiner 100
110
111
121
122
$V_{write}$
$\frac{V_{write}}{2}$
$\frac{V_{write}}{3}$
$\frac{2V_{write}}{3}$
Selected cells
Half-selected cells
Unselected cells
0 V TABLE I: Summary of parameters for write operation

| Parameters | Values |
|---|---|
| $R_{on}$ | $10^4\ \Omega$ |
| $R_{off}$ | $10^7\ \Omega$ |
| $t_{sw}$ | $100\ ns$ |
| $V_{write}$ | $4\ V$ |

ENERGY EFFICIENT WRITE SCHEME FOR NON-VOLATILE RESISTIVE CROSSBAR ARRAYS WITH SELECTORS

CROSS-REFERENCE TO RELATED APPLICATIONS

This application claims priority to and the benefit of co-pending International Patent Application No. PCT/US18/15901, ENERGY EFFICIENT WRITE SCHEME FOR NON-VOLATILE RESISTIVE CROSSBAR ARRAYS WITH SELECTORS, filed Jan. 30, 2018 and published as WO2019125507A1 and U.S. provisional patent application Ser. No. 62/608,055, ENERGY EFFICIENT WRITE SCHEME FOR NON-VOLATILE RESISTIVE CROSSBAR ARRAYS WITH SELECTORS, filed Dec. 20, 2017, which application is applications are incorporated herein by reference in its their entirety.

FIELD OF THE APPLICATION

The present invention relates to crossbar arrays, particularly to biasing of resistive crossbar arrays.

BACKGROUND

Resistive memories are expected to replace charge based conventional memories. Charge based conventional memories suffer from scalability limitations, while resistive memories have demonstrated energy benefits due to their non-volatility characteristics. Resistive memory devices include resistive RAM (RRAM), phase change memory (PCM), and magnetoresistive RAM (MRAM).

SUMMARY

According to one aspect, a method to adaptively and dynamically set a bias scheme of a crossbar array for a write operation includes: performing a read-before-write operation to determine a number of cells n to be written during a write operation; comparing n to a predetermined threshold value $n_{th}$ to determine an efficient bias scheme; setting at least one voltage regulator to provide a bias voltage according to the efficient bias scheme; and performing the write operation.

In one embodiment, the step of comparing n to a predetermined threshold value $n_{th}$ to determine an efficient bias scheme includes a first bias scheme where $n<n_{th}$, and a second bias scheme where $n>n_{th}$.

In another embodiment, the first bias scheme includes a V/2 bias.

In yet another embodiment, the second bias scheme includes a V/3 bias.

In yet another embodiment, the step of running a read-before-write operation includes counting a number of cells that will switch during the write operation.

In yet another embodiment, the write operation includes executing a write pulse.

In yet another embodiment, the step of setting at least one voltage regulator includes setting a tunable linear regulator.

In yet another embodiment, the step of setting at least one voltage regulator includes setting a capacitor-less regulator.

In yet another embodiment, a crossbar array integrated circuit includes an on-chip integrated logic section to run the method.

According to another aspect, a method to determine threshold value $n_{th}$ to determine an efficient bias scheme of a crossbar array includes: providing an array size and ratio of a non-linearity factor of a crossbar array; and based on the array size and the ratio of a non-linearity factor, determining a threshold value $n_{th}$ where at least two different bias schemes exhibit substantially a same energy use for write operations.

In one embodiment, the step of determining a threshold value includes a non-linearity factor defined by an equation $$K_r = \frac{K_{V/3}}{K_{V/2}},$$

where $K_{V/3}$ is a non-linearity factor for a V/3 bias scheme and $K_{V/2}$ is a non-linearity factor for a V/2 bias scheme.

In another embodiment, the step of determining a threshold value includes an equation:

$$K_{V/2} = \frac{I_{cell}(V_{write})}{I_{cell}(V_{write}/2)} = 2 \times \frac{R_{on@V_{write}/2}}{R_{on}}, \text{ and}$$

$$K_{V/3} = \frac{I_{cell}(V_{write})}{I_{cell}(V_{write}/3)} = 3 \times \frac{R_{on@V_{write}/3}}{R_{on}}$$

where $I_{cell}(V_{write})$, $I_{cell}(V_{write}/2)$, $I_{cell}(V_{write}/3)$ are, respectively, a current passing through a cell when a cell voltage is equal to a write voltage, one half of a write voltage, and one third of a write voltage, and $R_{on}$, $R_{on@V_{write}/2}$, and $R_{on@V_{write}/3}$ are, respectively, a cell resistance during an on-state when a cell voltage is equal to a write voltage, one half of a write voltage, and one third of a write voltage.

In yet another embodiment, the step of determining a threshold value includes an equation:

$$n_{th} = \frac{2N^2 - 3K_rN}{3K_rN - 6K_r + 2}, \text{ where } K_r = \frac{K_{V/3}}{K_{V/2}},$$

and N is the array size.

According to yet another aspect, an energy efficient crossbar array device includes an integrated crossbar array with an I/O control, read/write control, row and column decoders and drivers, and a data port. A read-before-write counter is coupled to the data port. The read-before-write counter is also coupled to a first input port of a comparator. A second input port of the comparator has as input, a predetermined threshold value. A program bias reference logic element is coupled to an output of the comparator. At least one settable bias generator or tunable voltage regulator is coupled to the program bias reference logic element. The at least one settable bias generator or tunable voltage regulator provides a bias voltage according to a bias scheme to at least one driver. The bias voltage is dynamically altered between at least a first bias scheme and a second bias scheme, responsive to a number of selected cells n during a write operation in comparison with the predetermined threshold value.

In one embodiment, the first bias scheme includes a V/2 bias scheme.

In another embodiment, the second bias scheme includes a V/3 bias scheme.

In yet another embodiment, the integrated crossbar array includes a non-volatile resistive crossbar array.

In yet another embodiment, the at least one settable bias generator or tunable voltage regulator includes an integrated linear regulator.

In yet another embodiment, the integrated linear regulator includes a capacitor-less regulator.

The foregoing and other aspects, features, and advantages of the application will become more apparent from the following description and from the claims.

BRIEF DESCRIPTION OF THE DRAWINGS

The features of the application can be better understood with reference to the drawings described below, and the claims. The drawings are not necessarily to scale, emphasis instead generally being placed upon illustrating the principles described herein. In the drawings, like numerals are used to indicate like parts throughout the various views.

DETAILED DESCRIPTION

Figures 1A, 1B, 1C:
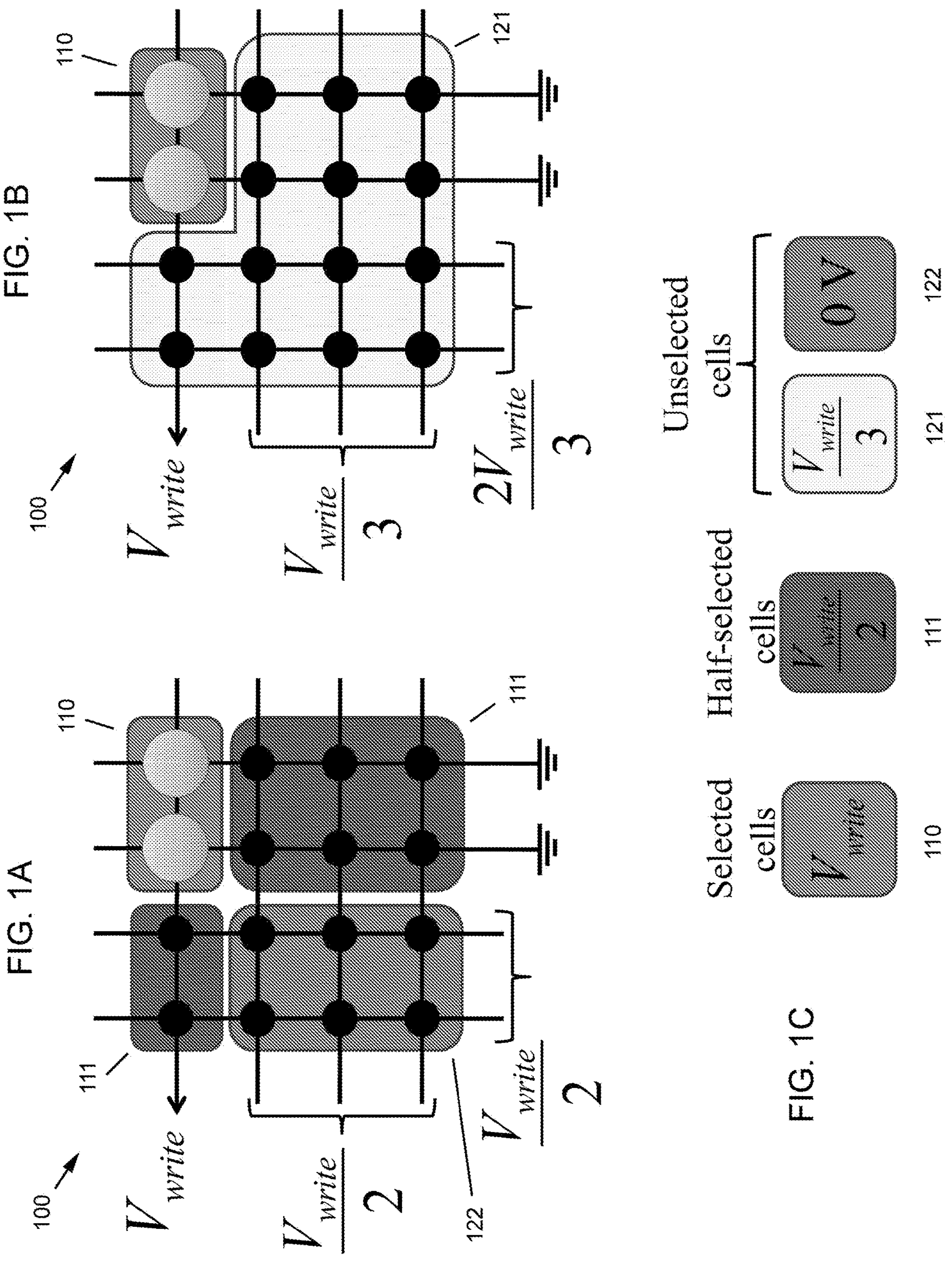
FIG. 1A is a diagram illustrating a bias scheme for a two bit write operation with a V/2 bias.
FIG. 1B is a diagram illustrating a bias scheme for a two bit write operation with a V/3 bias.
FIG. 1C is legend showing selected cells, half-selected cells, and unselected cells for FIG. 1A and FIG. 1B.

In the description, other than the bolded paragraph numbers, non-bolded square brackets ("[ ]") refer to the citations listed hereinbelow.

The write operation of a resistive memory based on a one-selector-one-resistor crossbar array consumes significant energy and is dependent on the device and circuit characteristics as well as the bias scheme. The energy efficiency of a crossbar array of a one-selector-one-resistor (1S1R) configuration during a write operation is described hereinbelow for V/2 and V/3 bias schemes. It was realized that through a new selection process V/2 and V/3 bias schemes, the energy efficiency of a crossbar array of a one-selector-one-resistor (1S1R) configuration during a write operation can be improved. Characteristics that affect the most energy efficient bias schemes are also described. The write energy of a crossbar array is modeled in terms of the array size, number of selected cells, and nonlinearity factor. For a specific array size and selector technology, the number of selected cells during a write operation can affect the choice of bias scheme. The effect of leakage current due to partially biased unselected cells is also described. Furthermore, an energy efficient write operation based on a hybrid bias scheme is described which reduces write energy. This new write operation adaptively sets a bias scheme based on the number of selected cells to enhance overall energy efficiency. Energy improvements of more than 2× have been demonstrated with this hybrid bias scheme.

Part 1—Introduction

As described hereinabove, resistive memories are expected to replace charge based conventional memories due to scalability limitations and energy benefits due to non-volatility characteristics. Resistive memory devices such as resistive RAM (RRAM), phase change memory (PCM), and magnetoresistive RAM (MRAM) have been explored for non-volatile memories [14, 19, 24, 25]. To achieve high density, these resistive devices are placed within a crossbar array structure. The area of a memory cell in a RRAM based crossbar array utilizing a two terminal one-selector-one-resistor (1S1R) configuration can be as low as $4F^2$, where F is the minimum feature size of a technology node [24]. These arrays can be placed within metal layers, supporting cell placement above the CMOS logic, further reducing area. Moreover, a crossbar array can be configured as a logic gate, providing a path to non-von Neumann in-memory computing [32]. To enable this capability, however, the energy consumption of a crossbar array should be within practical limits due to thermal design power (TDP) envelope constraints in high performance integrated circuits (ICs) and the limited battery size of mobile devices. The energy consumption of 1S1R memories increases significantly as the size of the array grows. In particular, the write energy is a large portion of the total energy and is significantly greater than the read energy [17]. This difference is due to the long switching times of the selected devices whereas the read latency primarily depends upon the sense amplifier which improves with technology scaling. The write latency is typically on the order of a few hundred nanoseconds whereas the read latency can be as low as 5 ns [31].

The energy consumption of a crossbar array during a write operation depends upon the bias scheme, typically a V/2 or V/3 bias scheme [4, 33] (See Part 2). Most of the work described in the prior art literature considers the V/2 bias scheme [17, 18]. The advantages of one bias scheme over the other bias scheme in terms of energy efficiency are unclear in the prior art. Furthermore, the V/2 bias scheme is often claimed to be more energy efficient than the V/3 bias scheme [25, 26]. The most energy efficient bias scheme can however vary depending upon the circuit and device characteristics. In particular, the selector device has a profound effect on the energy consumption since the leakage currents due to partially biased cells increases with array size. The selector device within a crossbar array suppresses the currents under a low voltage bias while supporting higher currents under a high voltage bias. Different three terminal devices such as an MOS transistor and bipolar junction transistor as well as two terminal devices such as a silicon-based diode and metal-insulator-metal tunneling barrier have been considered [27, 29]. Three terminal transistor based selector devices provide greater isolation between the selected cells and unselected cells within a crossbar array. This solution however significantly increases cell area and inhibits scalability. Two terminal selectors can however be vertically integrated within a non-volatile resistive cell, preserving the area. A wide range of two terminal selectors exist which can be classified into two categories, unipolar and bipolar. In addition, depending upon the material and the non-volatile resistive cell, the selector can be a silicon based diode, self-rectifying device, or metal-insulator-metal (MIM) with different kinds of tunneling mechanisms depending upon the thickness of the insulator material [28]. In this Application to illustrate the new device structure and method, an exemplary 1S1R element is used to refer to a non-volatile resistive cell integrated with a two terminal selector device. To incorporate the effects of the selector within an array, the nonlinearity factor is used as the primary metric to quantify the isolation capability (See Part 2).

In this Application, write bias schemes are compared from an energy efficiency point of view for the exemplary 1S1R crossbar arrays with two terminal selectors. It is shown here that the bias scheme that provides the highest energy efficiency depends upon several parameters such as the nonlinearity factor of the selectors, size of the array, and number of selected cells during a write operation. Closed-form expressions that model the write energy of a crossbar array in terms of these parameters, excluding the peripheral circuitry, are provided for the case where the interconnect resistance is negligible. The exemplary models are applicable to both unipolar and bipolar devices. Most of the prior art does not consider the effects of writing multiple bits (i.e., multiple selected cells) on the energy consumption of an array. In [17] and [18], the power consumption when selecting multiple bits is considered; however, only for the V/2 bias scheme. In this Application, newly realized devices and methods for writing multiple bits on the energy efficiency of different bias schemes are described. Moreover, the effects of leakage current on energy consumption are discussed. In addition, an energy efficient write scheme is described that adaptively utilizes both the V/2 and the V/3 bias schemes to lower the write energy. Based on the described write operation, the new bias scheme alters for maximum energy efficiency depending upon the number of selected bits, which can vary for different write operations. In Part 2, the bias schemes during a write operation are described. In Part 3, models of the energy consumption are described. In Part 4, the new energy efficient write scheme of the Application is described. Part 5 is the conclusion.

Part 2—Write Operations

The two types of write bias schemes, V/2 and V/3, for a crossbar array such as the exemplary crossbar array 100 of FIG. 1A, FIG. 1B, and FIG. 1C. FIG. 1A shows a bias scheme for a two bit write operation with a V/2 bias. FIG. 1B shows a bias scheme for a two bit write operation with a V/3 bias. FIG. 1C shows a legend of selected cells 110, half-selected cells 111, and unselected cells ($V_{write}/3$ 121, 0V 122) for FIG. 1A and FIG. 1B.

For the V/2 bias scheme, the selected wordline is connected to the write voltage while the selected bitlines are grounded. The unselected wordlines as well as bitlines are biased to half of the write voltage. Similarly, for the V/3 bias scheme, the selected wordline is connected to the write voltage while the selected bitlines are grounded. The unselected wordlines are biased at one third of the write voltage whereas the unselected bitlines are biased at two thirds of the write voltage. The voltage drop across the unselected cells along the selected wordline and selected bitlines, also called the half-selected cells, are therefore biased at one half of the write voltage for the V/2 bias scheme. For the V/3 bias scheme, this voltage decreases to one third of the write voltage. More importantly, the cells on the unselected wordlines and bitlines are at zero voltage for the V/2 bias scheme and at one third of the write voltage for the V/3 bias scheme, resulting in a large number of cells leaking current when the V/3 bias scheme is applied.

The leakage current of the unselected cells depends upon the nonlinearity factor of the selector. The two terminal selector is placed above a resistive cell to form a nonlinear I-V characteristic. A selector with a higher nonlinearity factor further decreases the current of the cell when biased below the threshold voltage of the selector [5]. The leakage current due to the partially biased unselected cells is therefore suppressed, decreasing IR voltage drops and supporting larger array sizes [1]. The nonlinearity factor of a selector is the ratio of the current passing through a selected cell to the current passing through a half-selected cell. The nonlinearity factor of the V/2 and V/3 bias schemes are, respectively, $$K_{V/2} = \frac{I_{cell}(V_{write})}{I_{cell}(V_{write}/2)} = 2 \times \frac{R_{on@V_{write}/2}}{R_{on}}, \quad \text{(equation 1)}$$

$$K_{V/3} = \frac{I_{cell}(V_{write})}{I_{cell}(V_{write}/3)} = 3 \times \frac{R_{on@V_{write}/3}}{R_{on}}, \quad \text{(equation 2)}$$

where $I_{cell}(V_{write})$, $I_{cell}(V_{write}/2)$, and $I_{cell}(V_{write}/3)$ are, respectively, the current passing through the cell when the cell voltage is equal to the write voltage, one half of the write voltage, and one third of the write voltage. $R_{on}$, $R_{on@V_{write}/2}$, and $R_{on@V_{write}/3}$ are, respectively, the cell resistance during an on-state when the cell voltage is equal to the write voltage, one half of the write voltage, and one third of the write voltage. The leakage current therefore depends upon the bias scheme, which is related to the nonlinearity factor.

The nonlinearity factor $K_{V/2}$ of a one-selector-one-resistor (1S1R) device is typically on the order of $10^1$ to $10^2$, whereas $K_{V/3}$ is on the order of $10^3$ to $10^4$ [5, 7-13]. A selector device with an on/off ratio as high as $10^8$ has recently been demonstrated [6]. The choice of bias scheme can therefore greatly affect the energy consumption.

Part 3 Energy Models

In Part 3, a model of the energy consumption of the V/2 and V/3 bias schemes is described. A design guideline for choosing the proper bias scheme is explained in Part 3.1. Moreover, the effect of the nonlinearity factor on the choice of bias scheme is described in Part 3.2. The effect of leakage current on the total energy consumption is discussed in Part 3.3.

To provide an intuitive closed-form expression that models the energy consumption of a crossbar array, the interconnect resistance is assumed to be negligibly small. Although this assumption is not always practical in large arrays, it permits the effects of the critical parameters on the energy consumption, such as the nonlinearity factor, size of the array, number of selected cells, and bias scheme, to be captured while retaining simplicity and providing intuitive expressions. An array with an equal number of rows and columns biased according to the V/2 and V/3 bias schemes, as illustrated in FIG. 1, is considered. The selected devices are modeled based on the VTEAM model [36] considering linear switching, and the remaining devices are modeled as resistors. The switching devices are considered to be symmetric with equal on/off threshold voltages and equal set/reset times. The switching energy during set and reset operations is therefore the same (See Appendix). Based on these considerations and assumptions, the energy consumption of a crossbar array for the V/2 and V/3 bias schemes are, respectively, $$E_{V/2} = V_{write}\frac{I_{on}}{K_{V/2}}\frac{(Nn+N-2n)}{2}t_{sw} + nE_{sw} \quad \text{(equation 3)}$$

$$E_{V/3} = V_{write}\frac{I_{on}}{K_{V/3}}\frac{(N^2-n)}{3}t_{sw} + nE_{sw} \quad \text{(equation 4)}$$

where $V_{write}$ is the write voltage, $I_{on}$ is the cell current when biased at the write voltage during the on state, N is the number of rows and columns, n is the number of selected cells, $t_{sw}$, is the switching time, and $E_{sw}$ is the switching energy consumption of the selected device, $$E_{sw} = \frac{V_{write}^2}{R_{off}-R_{on}}\ln\left(\frac{R_{off}}{R_{on}}\right)t_{sw} \quad \text{(equation 5)}$$

$R_{on}$ and $R_{off}$ are, respectively, the 1S1R cell resistance during the on and off states (for more details see the Appendix). The resistance of the selector device due to the limited current density is assumed to be considered in $R_{on}$ and $R_{off}$. Note that the second term in (3) and (4) is the dynamic portion of the total energy due to switching the selected cells while the first term is due to the leakage current of the half-selected and unselected cells.

Figure 2A:
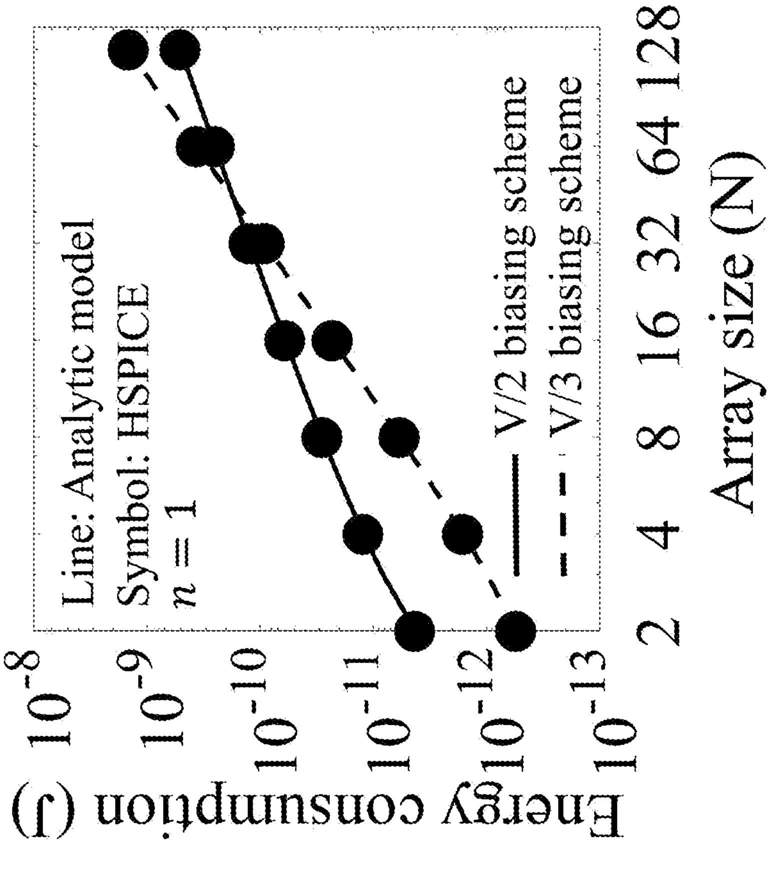
FIG. 2A is a graph showing energy consumption of a crossbar array with respect to an array size.
Figure 2B:
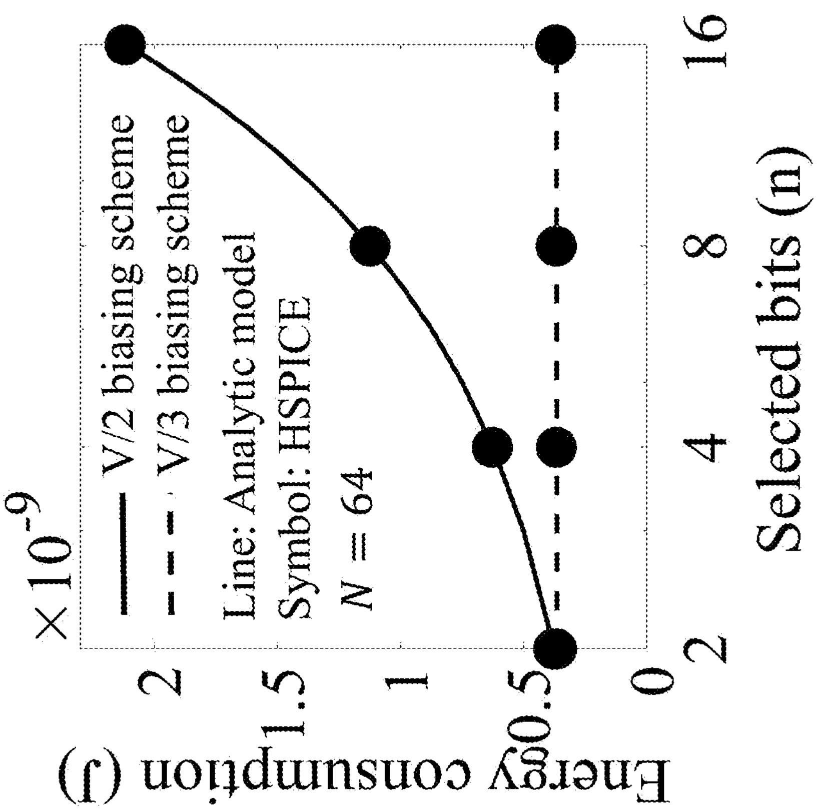
FIG. 2B is a graph showing energy consumption of a crossbar array with respect to a number of selected cells.

The closed-form expressions are in good agreement with modeling in SPICE, exhibiting an average error of 0.04% and a maximum error of 0.74%, as shown in FIG. 2A and FIG. 2B. FIG. 2A is a graph showing energy consumption of a crossbar array with respect to an array size. FIG. 2B is a graph showing energy consumption of a crossbar array with respect to a number of selected cells. For both of FIG. 2A and FIG. 2B, $R_{on}=10^4\Omega$, $R_{off}=10^7\Omega$, $K_{V/2}=20$, $K_{V/3}=1{,}000$, and $V_{write}=2$ V.

Figures 3A, 3B:
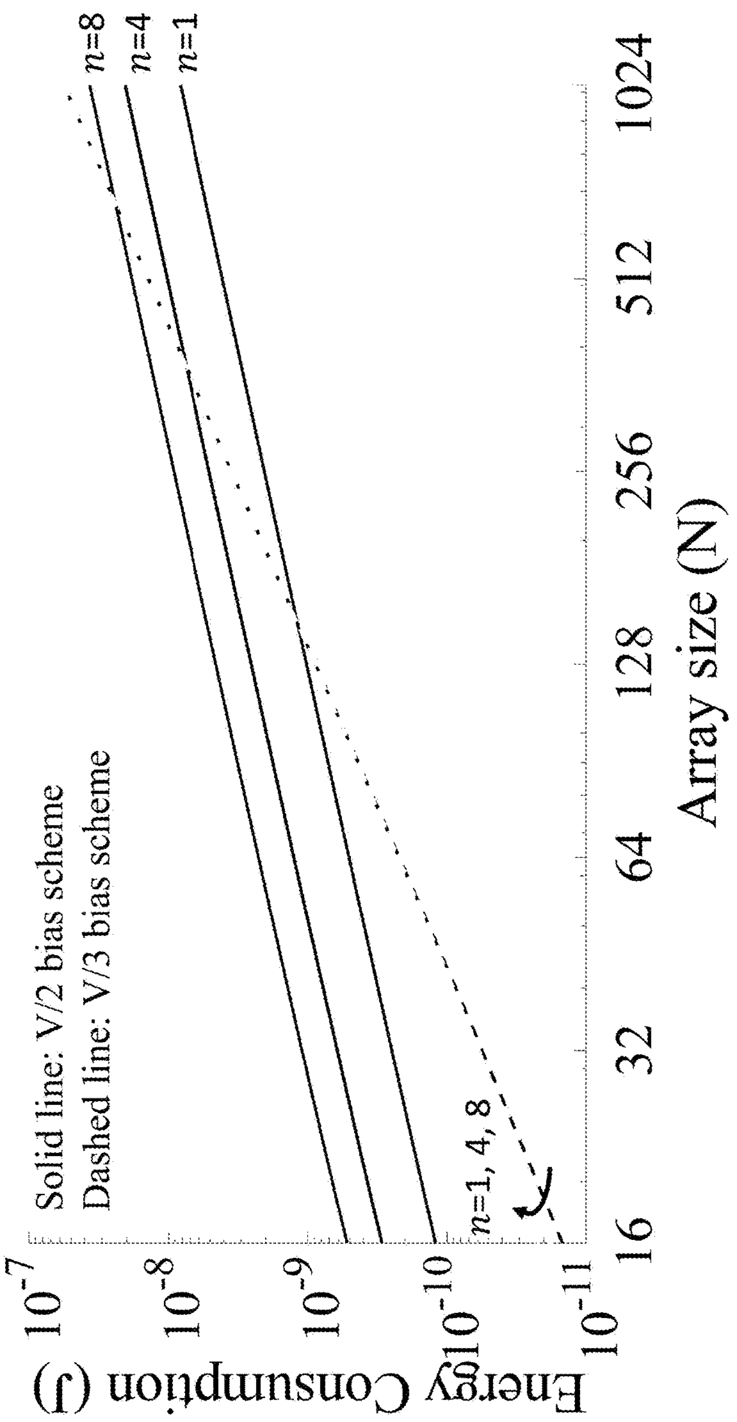
FIG. 3A is a graph showing the effect of the number of selected cells on the energy consumption of a crossbar array for the V/2 and V/3 bias schemes.
FIG. 3B is a table showing a summary of parameters for a write operation.

The energy consumption scales differently with respect to array size for different bias schemes. The V/2 bias scheme follows a linear trend, whereas the V/3 bias scheme scales superlinearly with array size (~$N^2$). Moreover, while the energy consumption for the V/2 bias scheme is strongly dependent on the number of selected cells, the V/3 bias scheme is constant for large arrays (N>>n). Note that $E_{V/3}$ quadratically scales with N, exhibiting a near constant profile with respect to n if N>>n. Under this condition, while the switching energy continues to grow with large n since the leakage energy dominates for large array sizes, $E_{sw}$ remains insignificant. The effect of n on the energy consumption for different array sizes is illustrated in the FIG. 3A. FIG. 3A is a graph showing the effect of the number of selected cells on the energy consumption of a crossbar array for the V/2 and V/3 bias schemes, assuming $K_{V/2}=20$ and $K_{V/3}=1{,}000$. FIG. 3B, Table 1 shows a summary of the parameters which are used in the following simulations (unless otherwise noted).

The increasing number of selected bits per write operation significantly adds to the energy consumption of the V/2 bias scheme. The V/3 bias scheme remains relatively constant for large array sizes. This behavior is due to the increasing number of half-selected cells for the V/2 bias scheme with increasing n. In contrast, for the V/3 bias scheme, the variation in the number of unselected cells become negligible as n increases if the size of the array N is much larger than n.

Figure 4:
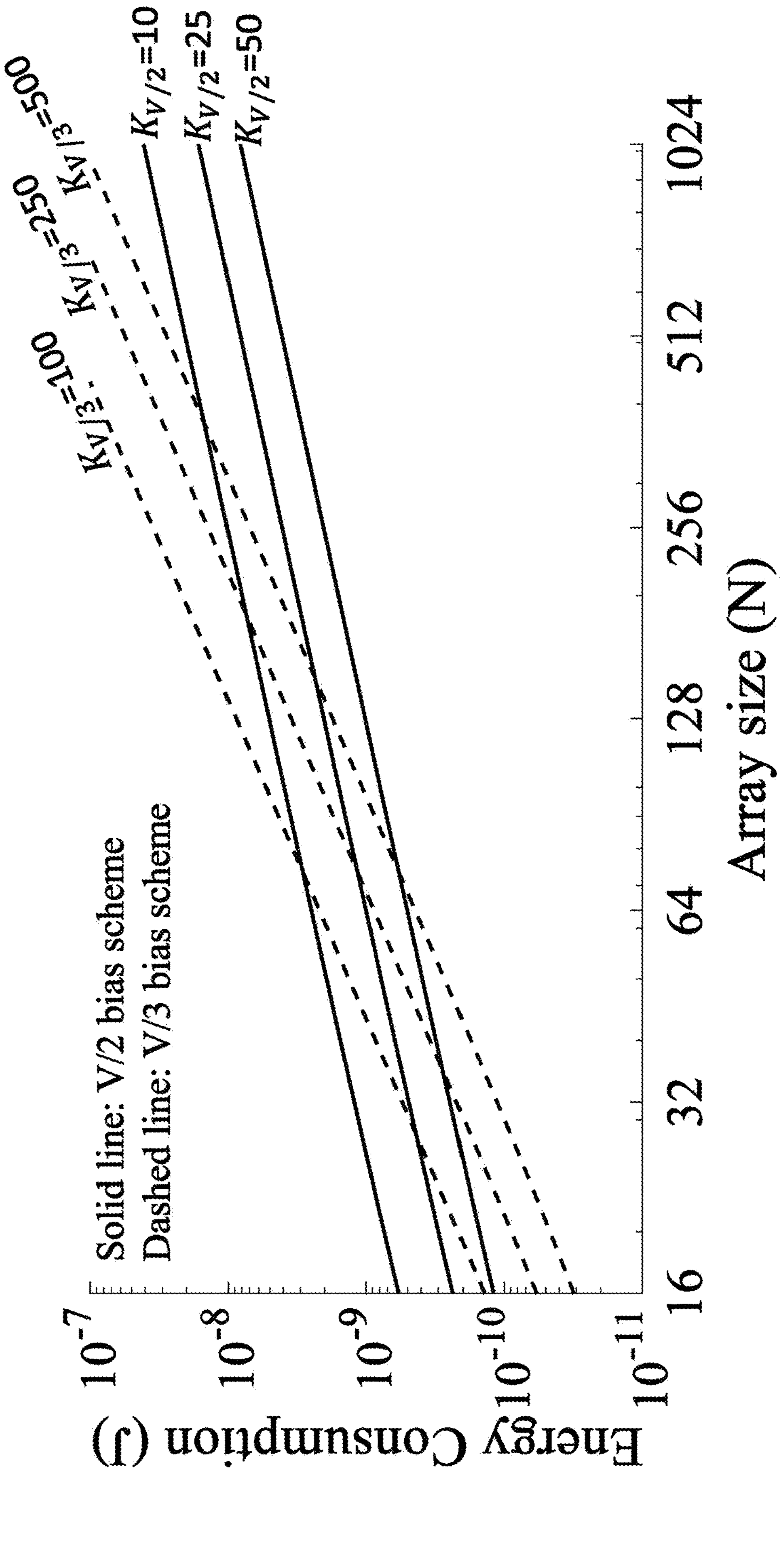
FIG. 4 is a graph showing the effect of the nonlinearity factor on the energy consumption of a crossbar array for the V/2 and V/3 bias schemes.

One method to decrease the energy consumption is by using selectors with a higher nonlinearity factor. A higher nonlinearity factor decreases the leakage current of the unselected cells, improving the ability of the selector to isolate the switching cell from the rest of the unselected array. The effect of the nonlinearity factor on the energy consumption is shown in FIG. 4. FIG. 4 is a graph showing the effect of the nonlinearity factor on the energy consumption of a crossbar array for the V/2 and V/3 bias schemes, assuming n=4. Note that with increasing nonlinearity factor, the energy consumed during both bias schemes decreases since (eq. 3) and (eq. 4) are, respectively, inversely proportional to $K_{V/2}$ and $K_{V/3}$.

Part 3.1—Energy Efficient Bias Scheme

Figure 5:
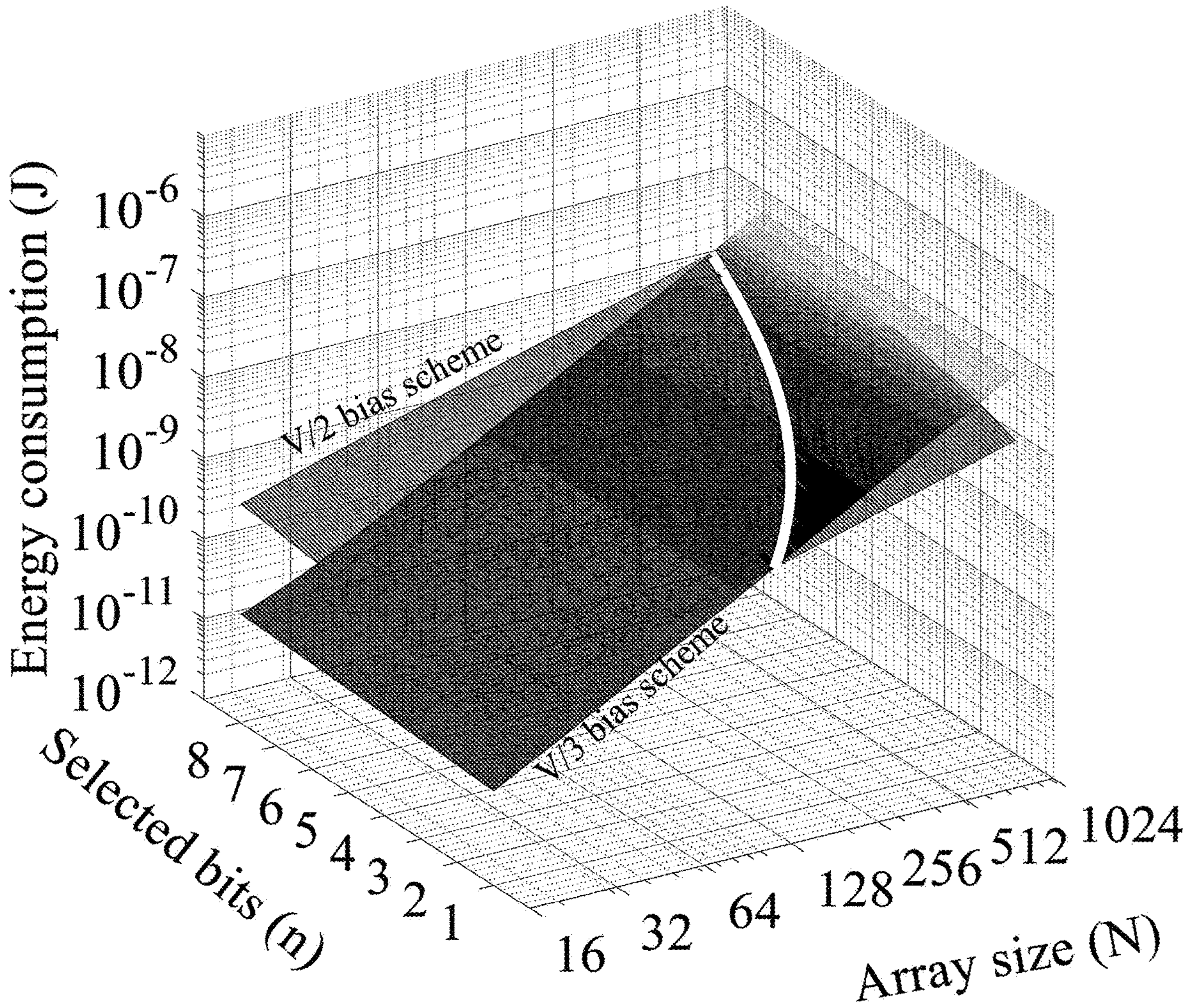
FIG. 5 is a 3D graph showing a comparison of the energy consumption in terms of the array size and number of selected cells for the V/2 and V/3 bias schemes.

Depending upon the array size, one bias scheme is more efficient than the other bias scheme. The number of selected cells n during a write operation may however alter the most energy efficient bias scheme, as shown in FIG. 5. FIG. 5 is a 3D graph showing a comparison of the energy consumption in terms of the array size and number of selected cells for the V/2 and V/3 bias schemes, assuming $K_{V/2}=20$ and $K_{V/3}=1{,}000$. Note that the line of intersection between the two bias schemes (where $E_{V/2}=E_{V/3}$) spans a range of array sizes (N=128,256, and 512) depending upon the number of selected bits. The line of intersection bends for different values of n because the V/2 bias scheme scales with the number of selected cells as opposed to the V/3 bias scheme which remains relatively constant.

Figure 6:
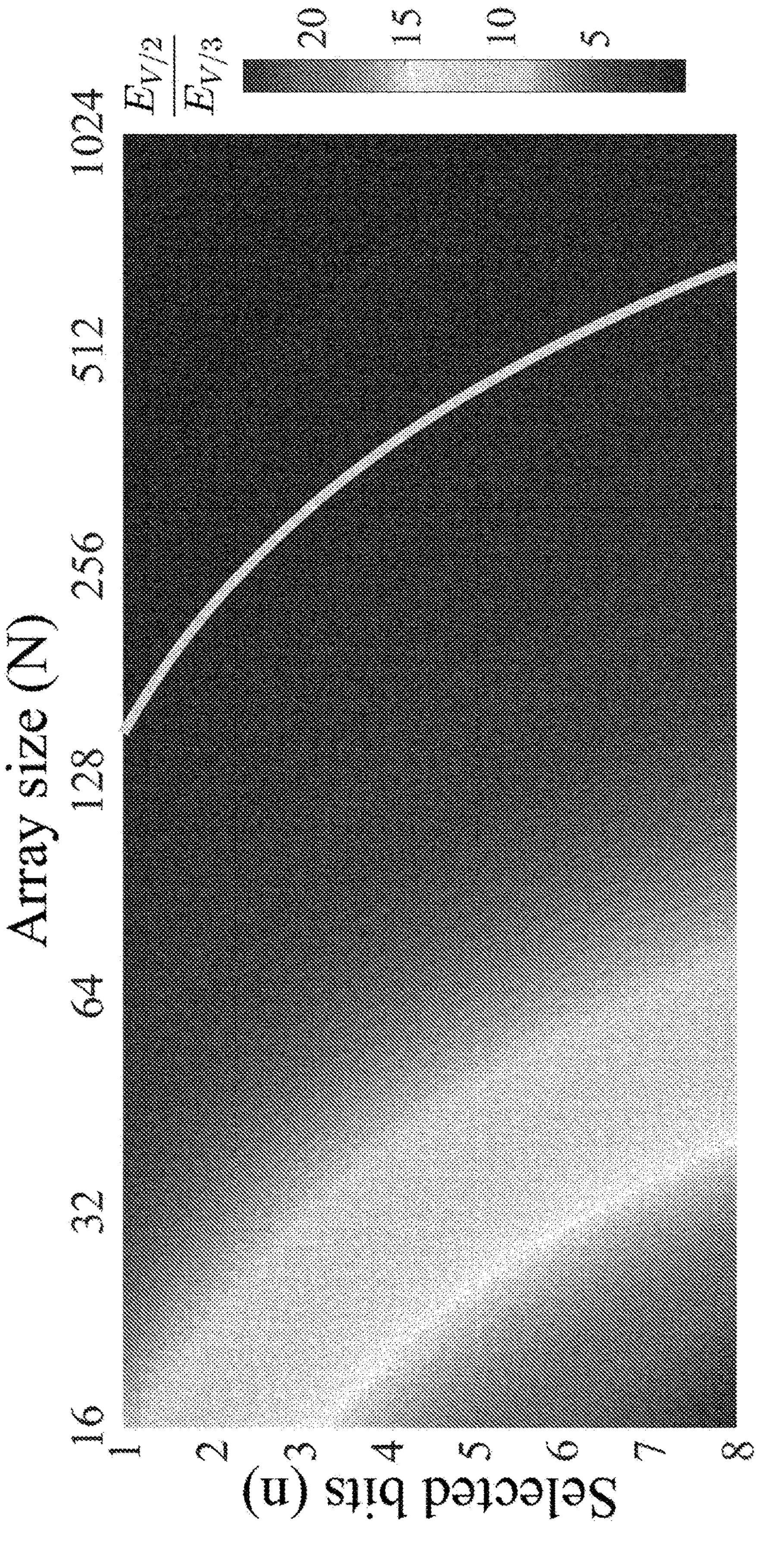
FIG. 6 is a contour plot showing energy savings of the V/3 bias scheme as compared to the V/2 bias scheme.

Extra energy is expended due to an incorrect choice of bias scheme, wasting significant power during a write operation. The ratio of the energy consumption between the two bias schemes is shown in FIG. 6. FIG. 6 is a contour plot showing energy savings of the V/3 bias scheme as compared to the V/2 bias scheme assuming the same parameters listed in FIG. 5. The solid line is the contour where the energy consumption between the two bias schemes is equal. The right side of the contour is the region where the V/2 bias scheme is more efficient than the V/3 bias scheme, and the left side is where the V/3 bias scheme is more efficient than the V/2 bias scheme. Because increasing the number of selected cells consumes more energy for the V/2 bias scheme for low n, the V/2 bias scheme remains more energy efficient over a wider range of array sizes. In contrast, for high n, the V/3 bias scheme is more energy efficient over a wider range of array sizes. The write energy can be as much as 5× lower for a 128×128 array and 10× lower for a 64×64 array using the V/3 bias scheme with eight selected bits. For large arrays, however, because the number of cells leaking current during the V/3 bias scheme scales with $N^2$, the V/2 bias scheme can consume as much as 7× lower energy for an array size of 1024×1024 with single bit operation.

The interconnect resistance changes the location of the contour (See FIG. 6) where the energy for both bias schemes is equal. Because the leakage current due to the half-selected cells for the V/2 bias scheme is significantly greater than the leakage current of the cells biased at one third of the write voltage, the IR voltage drops are greater for the V/2 bias scheme [1]. Thus, the voltage drop across the selected cells for the V/2 bias scheme is smaller than for the V/3 bias scheme. The switching time of the selected cells for the V/2 bias scheme is therefore longer, increasing the energy consumption [36] and resulting in the V/3 bias scheme being more energy efficient. This effect is more pronounced with larger IR voltage drops, resulting in slower switching times.

Part 3.2—Impact of Nonlinearity Factor

The bias scheme affects the total leakage current due to the difference between the nonlinearity factors and the number of leaking cells. While the size of the array as well as the number of selected bits affect the choice of energy efficient bias scheme, the difference between the nonlinearity factors ($K_{V/2}$ and $K_{V/3}$) determines the range of N and n at which the two energy consumptions, $E_{V/2}$ and $E_{V/3}$, are equal. For instance, if one nonlinearity factor is much greater than the other nonlinearity factor, the bias scheme that provides the higher nonlinearity factor will be the most energy efficient bias scheme for a wide range of N and n. The ratio of the two nonlinearity factors, $K_{V/2}$ and $K_{V/3}$, is a function of the array size and number of selected cells. Based on this ratio, for the V/3 bias scheme to be more energy efficient than the V/2 bias scheme, the following condition should be satisfied, $$\frac{K_{V/3}}{K_{V/2}} \geq \frac{2}{3}\frac{N^2 - n}{Nn + N - 2n} \quad \text{(equation 6)}$$

Figure 7:
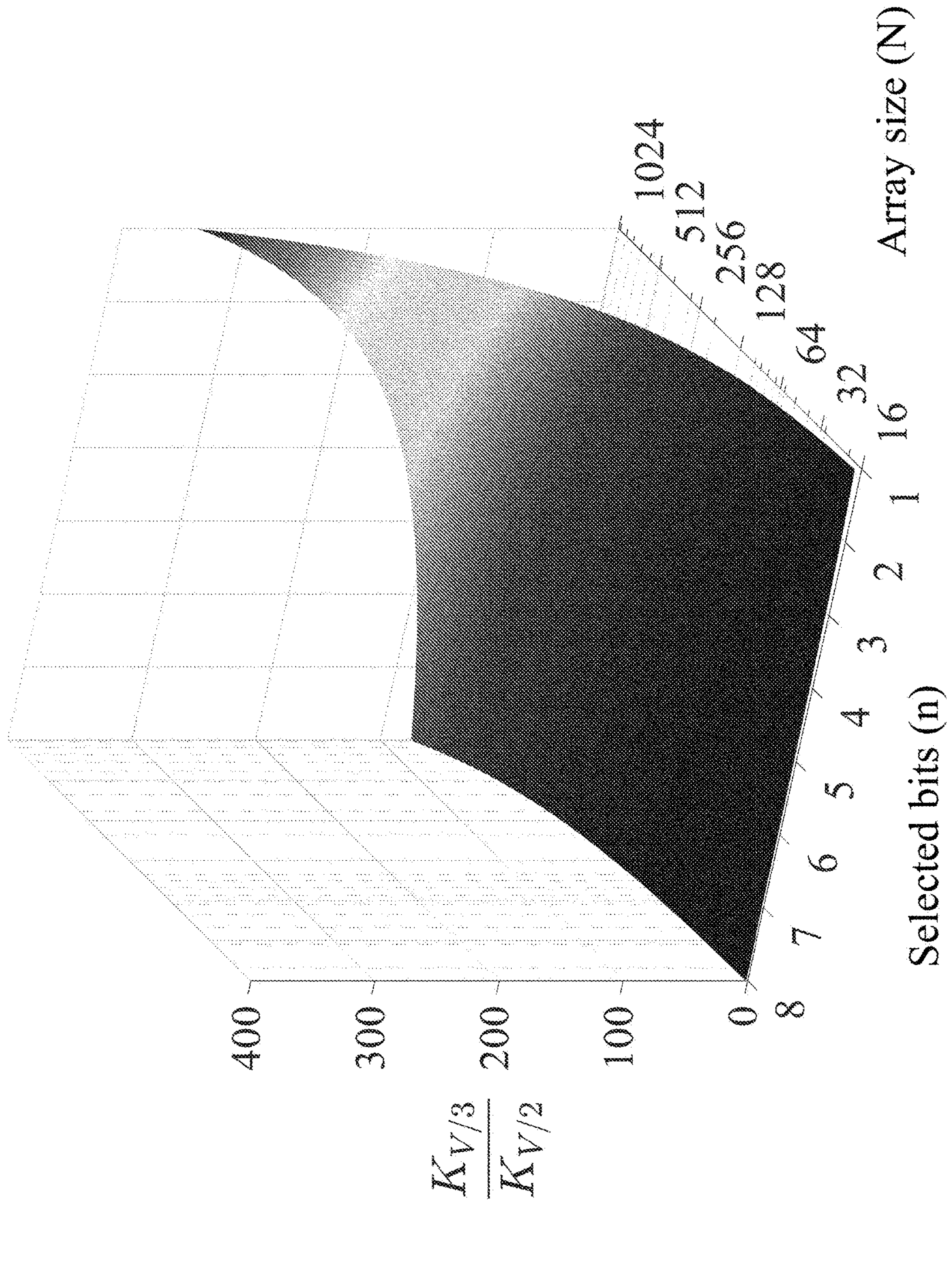
FIG. 7 is a 3D contour plot showing a Ratio of the nonlinearity factors $K_{V/3}$ to $K_{V/2}$.

Note that for negligible parasitic interconnect resistance, (eq. 6) is a function of the size of the array and number of selected cells. The variation of $K_{V/3}$ to satisfy (eq. 6) is shown in FIG. 7. FIG. 7 is a 3D contour plot showing a ratio of the nonlinearity factors $K_{V/3}$ to $K_{V/2}$ to maintain equal energy consumption for the V/2 and V/3 bias schemes in terms of the array size and number of selected cells. The V/3 bias scheme is more energy efficient if $K_{V/3}$ is at least two orders of magnitude greater than $K_{V/2}$ for array sizes up to 1024×1024 with six selected bits or an array size up to 256×256 with a single selected bit.

Part 3.3—Write Pulse Width

Figure 8:
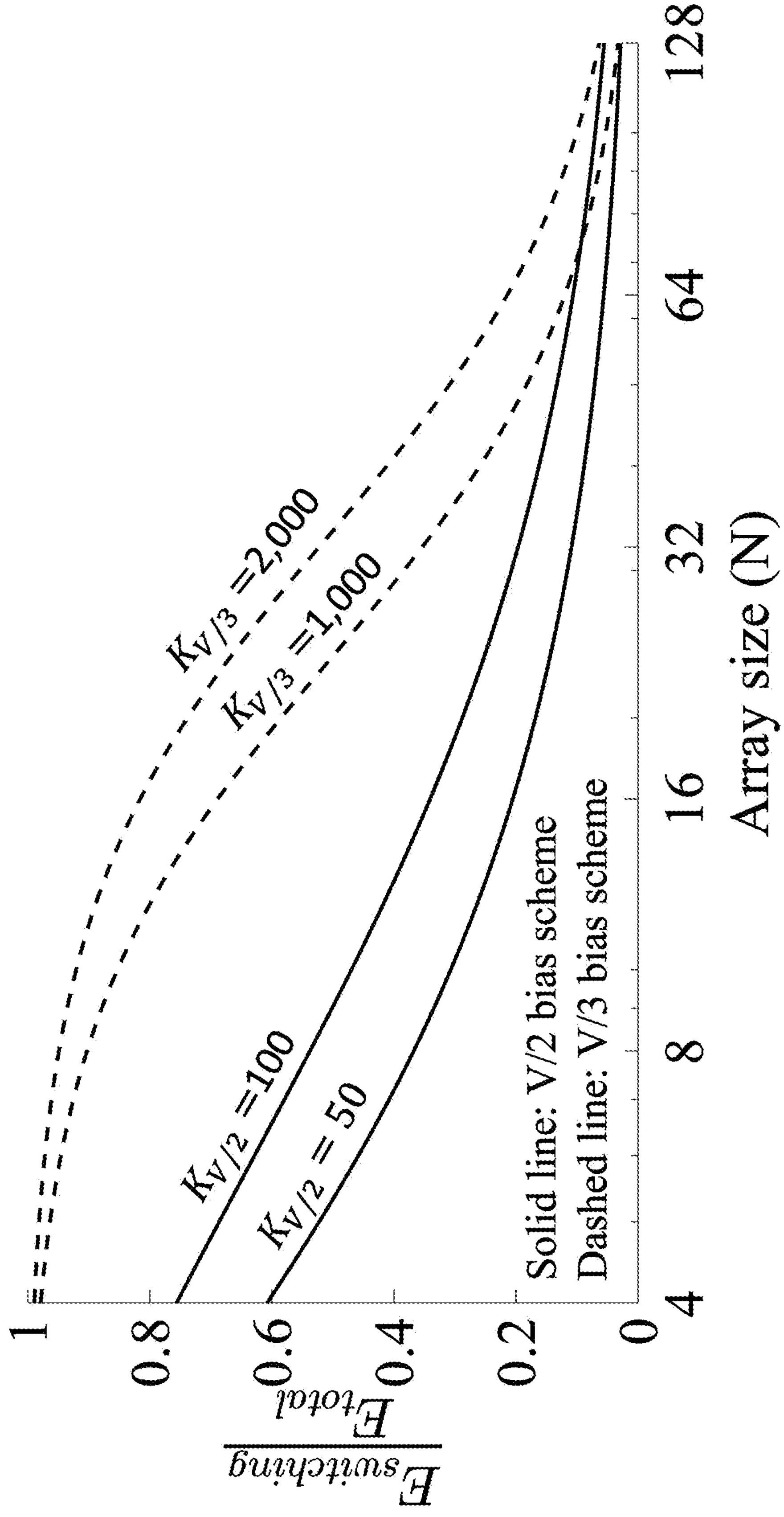
FIG. 8 is a graph showing a ratio of the switching energy to the total energy in terms of the array size.

The pulse width to successfully program the selected cells depends upon the switching time of the cells. While shorter pulses may produce write failures, extended pulse widths may consume excessive power, degrading the energy efficiency. Due to the significance of the leakage current of the unselected cells, the pulse width should be set with precision. For large arrays, the leakage current portion of the total energy dominates, making the switching energy $E_{sw}$ negligible, as shown in FIG. 8. FIG. 8 is a graph showing a ratio of the switching energy to the total energy in terms of the array size where $R_{on}=10^4\Omega$, $R_{off}=10^6\Omega$, and n=4.

Note that the switching energy for the V/3 bias scheme is a larger portion of the total energy as compared to the V/2 bias scheme. This difference is due to the smaller leakage current for the V/3 bias scheme due to the larger nonlinearity factor, $K_{V/3}$. Similarly, a higher nonlinearity factor reduces the leakage energy, resulting in the switching energy being more pronounced and exhibiting greater energy efficiency. The switching energy is less than 10% of the total energy for array sizes exceeding N=128.

To lower the energy due to leakage currents, the pulse width can be set as precisely as possible, sufficient to switch the selected cells. This excess energy due to leakage currents uses write termination circuitry to isolate the write voltage from the array once successful switching is achieved. While write termination techniques have been adopted for resistive cells based on STT-MRAM due to the stochastic nature of the switching process [35], a similar approach in RRAM based 1S1R crossbar arrays can be useful to save energy since an over extended write pulse can significantly reduce the energy efficiency due to the large leakage currents. The write termination circuitry exhibits a negligible energy overhead of, on average, less than 100 fJ [35].

Part 4—Energy Efficient Hybrid Write Scheme

In Part 4, a write scheme is described which improves the energy efficiency of a crossbar array during write operations. The optimal choice of the energy efficient bias scheme is explained in Part 4.1. System and process overhead is discussed in Part 4.2.

Figure 9:
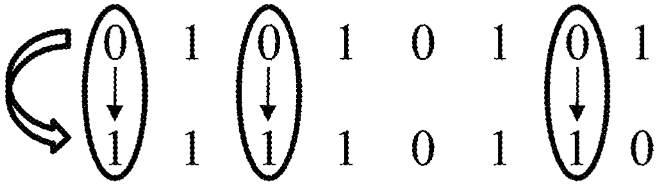
FIG. 9 illustrates writing an eight bit word.

The number of selected cells affects the energy of an array and can be used to determine the most energy efficient bias scheme. The described write scheme improves the energy efficiency by adaptively switching between the V/2 and V/3 bias schemes depending upon the number of selected cells during a write operation. The number of selected bits during a write operation depends upon the difference between the patterns of the old data and the new data, as shown in FIG. 9. FIG. 9 illustrates writing an eight bit word. Four bits of the new string are the same as the old string; however, only three bits are selected since one bit requires a reset whereas the other three bits require a set operation.

Consider a word size of eight bits. If the new data are the same as the old data, the number of selected cells is equal to zero. If, however the new data are different than the previous data, the number of selected cells depends separately upon the number of sets and resets, since in resistive memories, writing a 1 or a 0 requires two different write operations. A read-before-write technique can be used to determine the number of bits [23]. This approach detects those cells that require switching, reducing excessive energy consumption during a write operation. By adopting a similar approach to monitor the number of selected cells during each write operation, the optimal energy efficient bias scheme can be determined.

Figure 10:
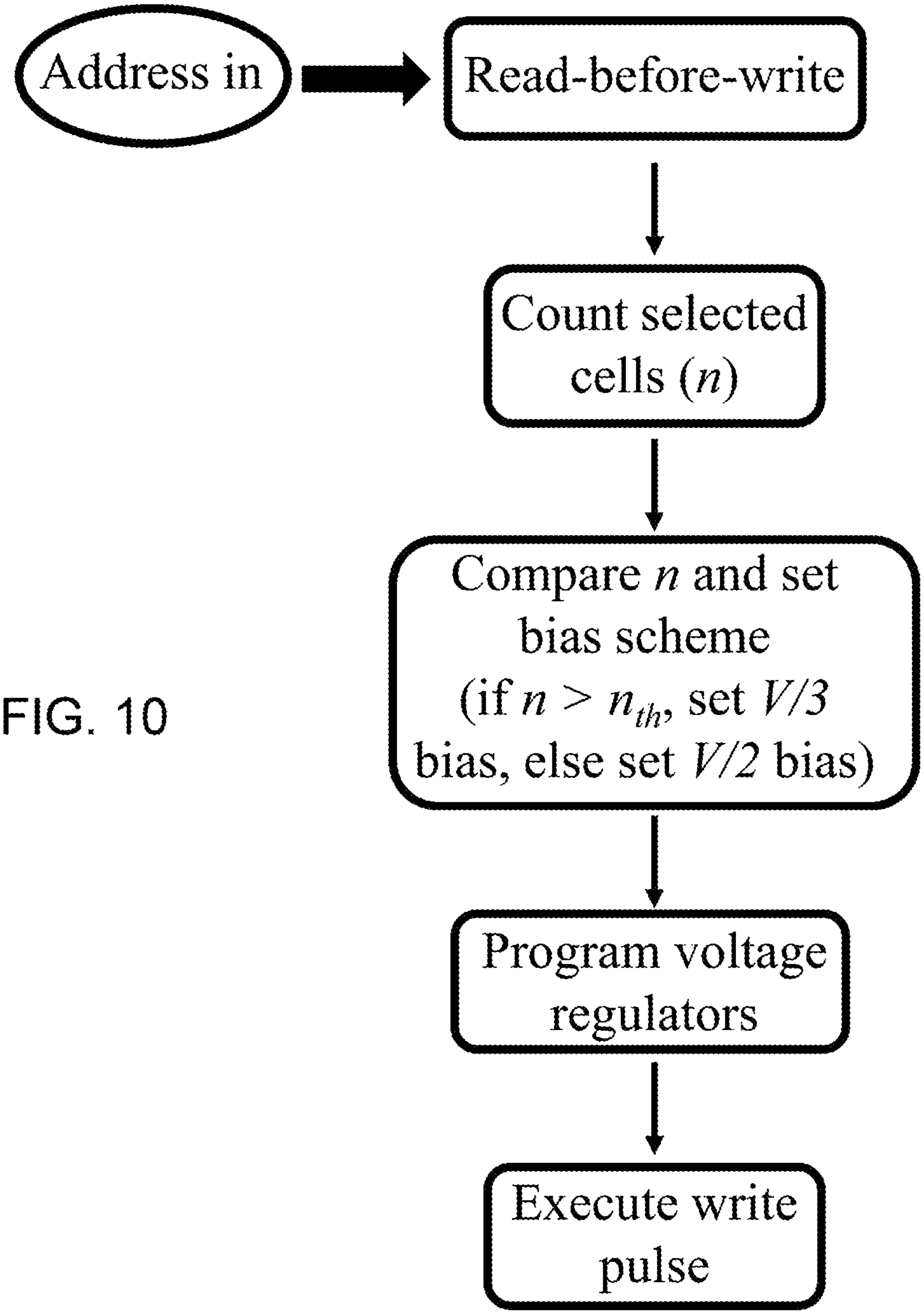
FIG. 10 is a process flow diagram showing exemplary steps of an energy efficient write scheme according to the Application.

The steps summarizing the write process using the energy efficient write scheme is shown in FIG. 10. FIG. 10 is a process flow diagram showing exemplary steps of an energy efficient write scheme according to the Application. The initial step is a read-before-write operation, followed by counting the number of cells that will switch for the new string of data. Once the number of selected cells n is known, n is compared to $n_{th}$ (See Part 4.1) for a specific array. Following this step, the power delivery system is configured to support either the V/2 or V/3 bias scheme to lower the energy. During this step the crossbar array remains idle, therefore no energy is consumed. Finally, once the regulator voltage converges to the appropriate bias scheme, the write pulse is executed to write the new data and complete the write process.

Part 4.1—Optimal Choice of Bias Scheme

Figure 11:
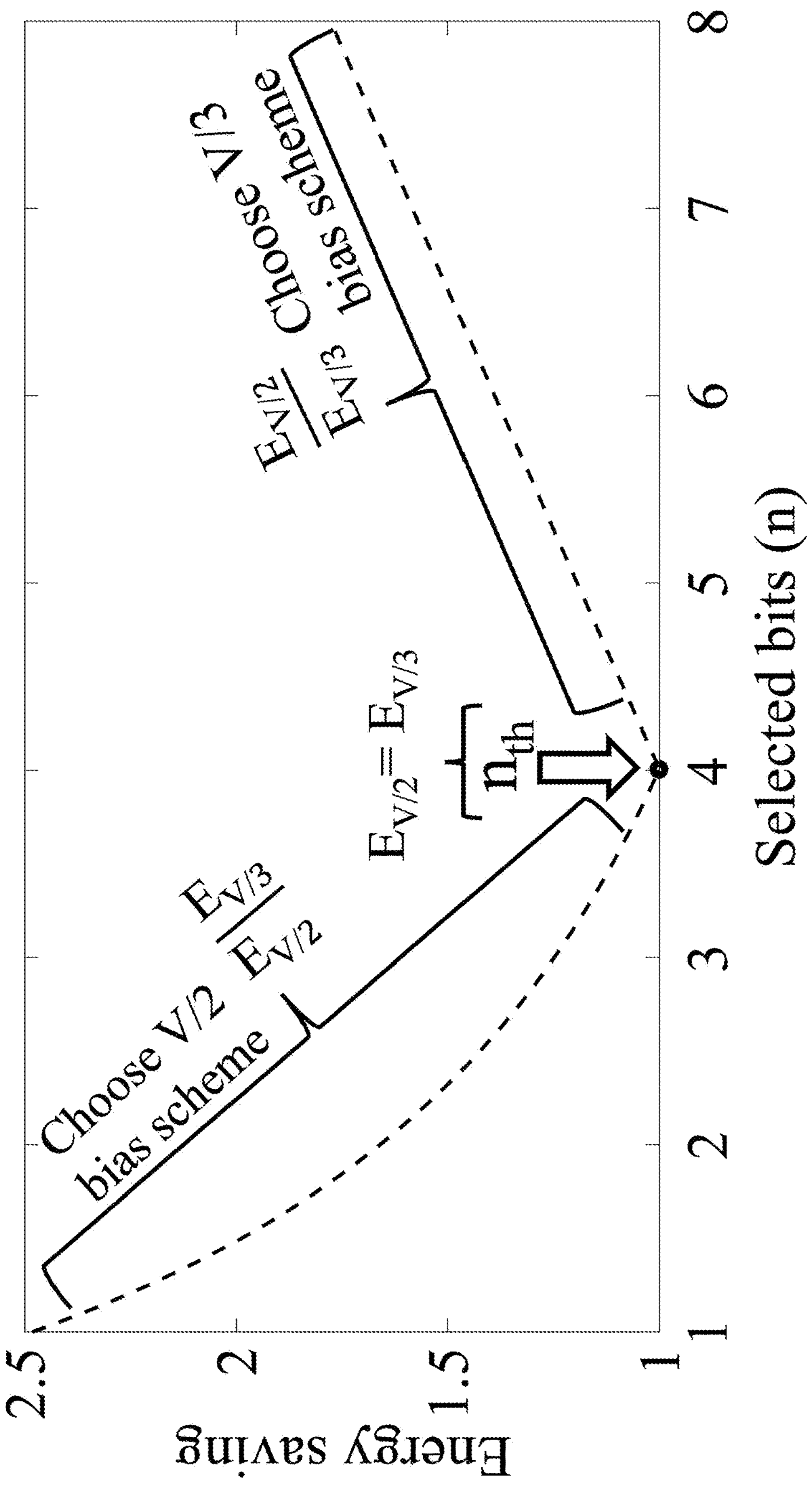
FIG. 11 is a graph showing energy improvement in terms of the number of selected cells.

The bias scheme of a crossbar array is altered when the number of selected cells n crosses a threshold, $n_{th}$. At this threshold, the write energy of the V/2 and V/3 bias schemes are equal. Since the energy for the V/2 bias scheme grows with increasing n, if $n<n_{th}$, the power delivery system switches to the V/2 bias scheme. If $n>n_{th}$, the power delivery system switches to the V/3 bias scheme. The energy savings in terms of the number of selected cells n is shown in FIG. 11. FIG. 11 is a graph showing energy improvement in terms of the number of selected cells, assuming N=128, $K_{V/2}$=20, and $K_{V/3}$=345. The write operation of the Application chooses the most energy efficient bias scheme based on the number of selected cells n with respect to $n_{th}$.

Note that if $n_{th}$ is four, the V/2 bias scheme provides as much as a 2.5× energy improvement for a 128×128 array when a single bit is selected. The V/3 bias scheme provides up to a 1.8× savings in energy when eight bits are selected. Note, however, the size of the array N as well as the ratio of the nonlinearity factor $K_r$ can affect the most energy efficient bias scheme. Depending upon N and $K_r$, $n_{th}$ may reside outside the range of allowed values of n.

Figure 12A:
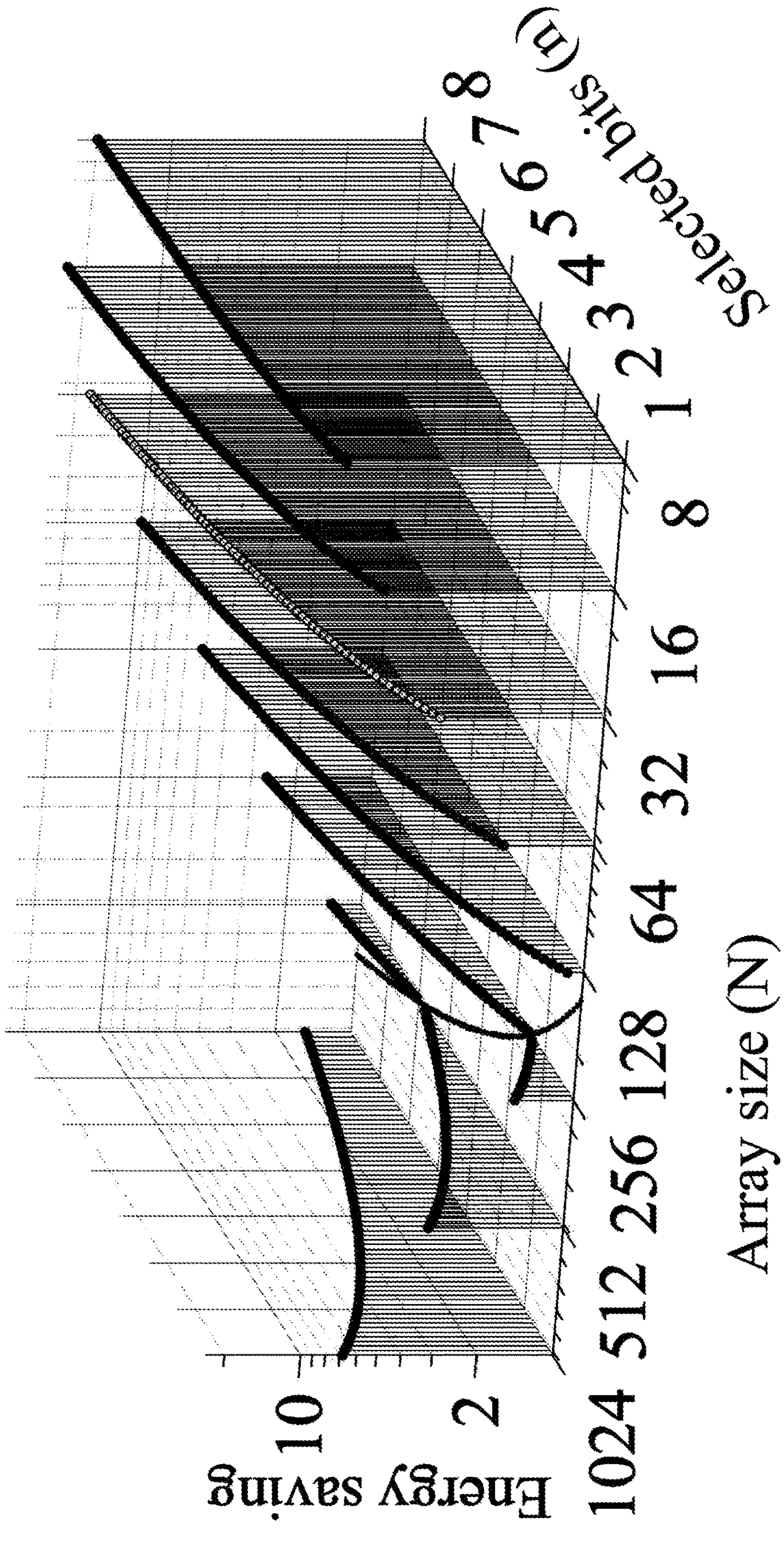
FIG. 12A is a 3D bar and curve graph illustrating energy savings for different array sizes and number of selected cells considering $K_r$=1000/20.
Figure 12B:
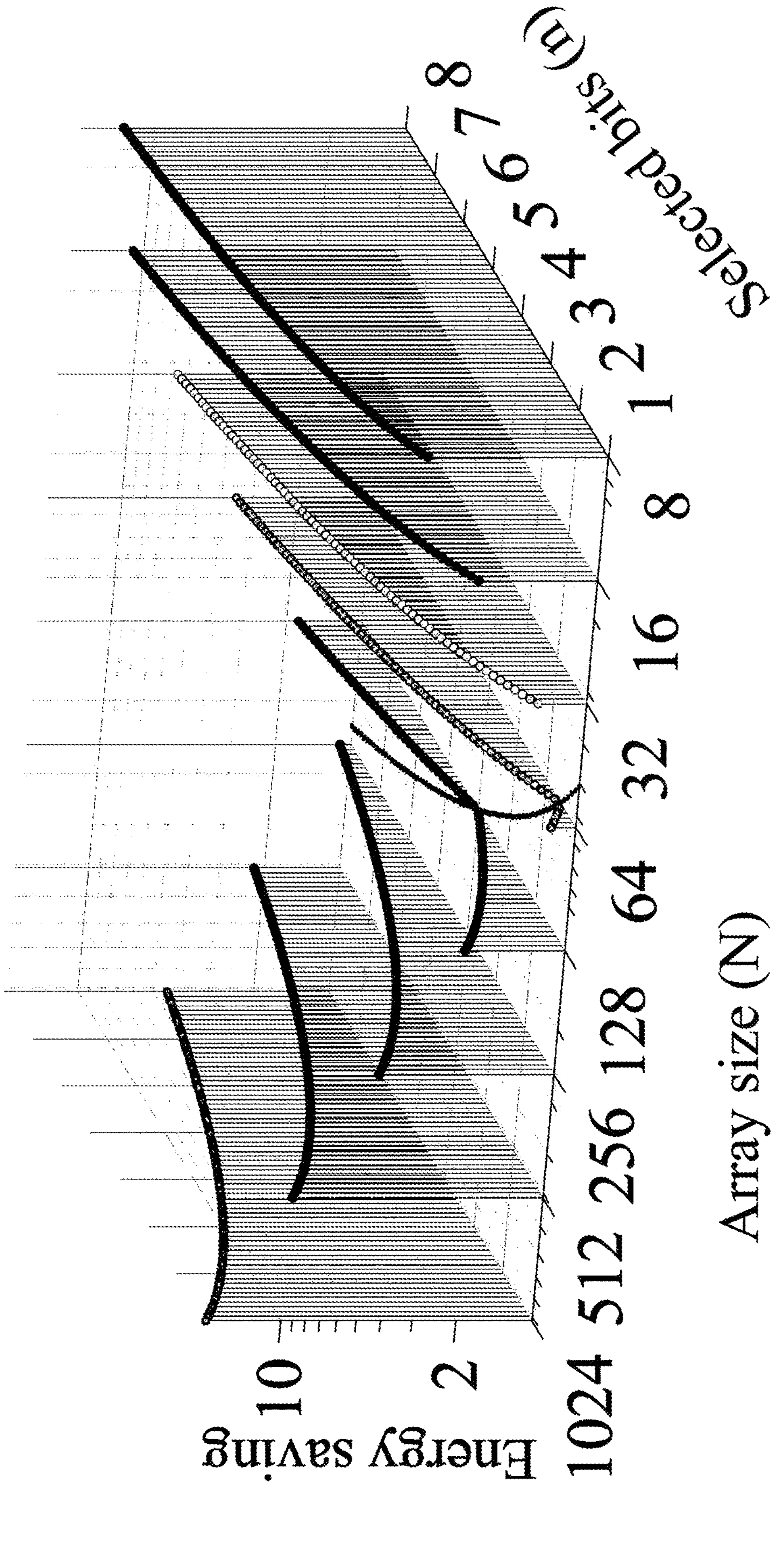
FIG. 12B is a 3D bar and curve graph illustrating energy savings for different array sizes and number of selected cells considering $K_r$=345/20.
Figure 12C:
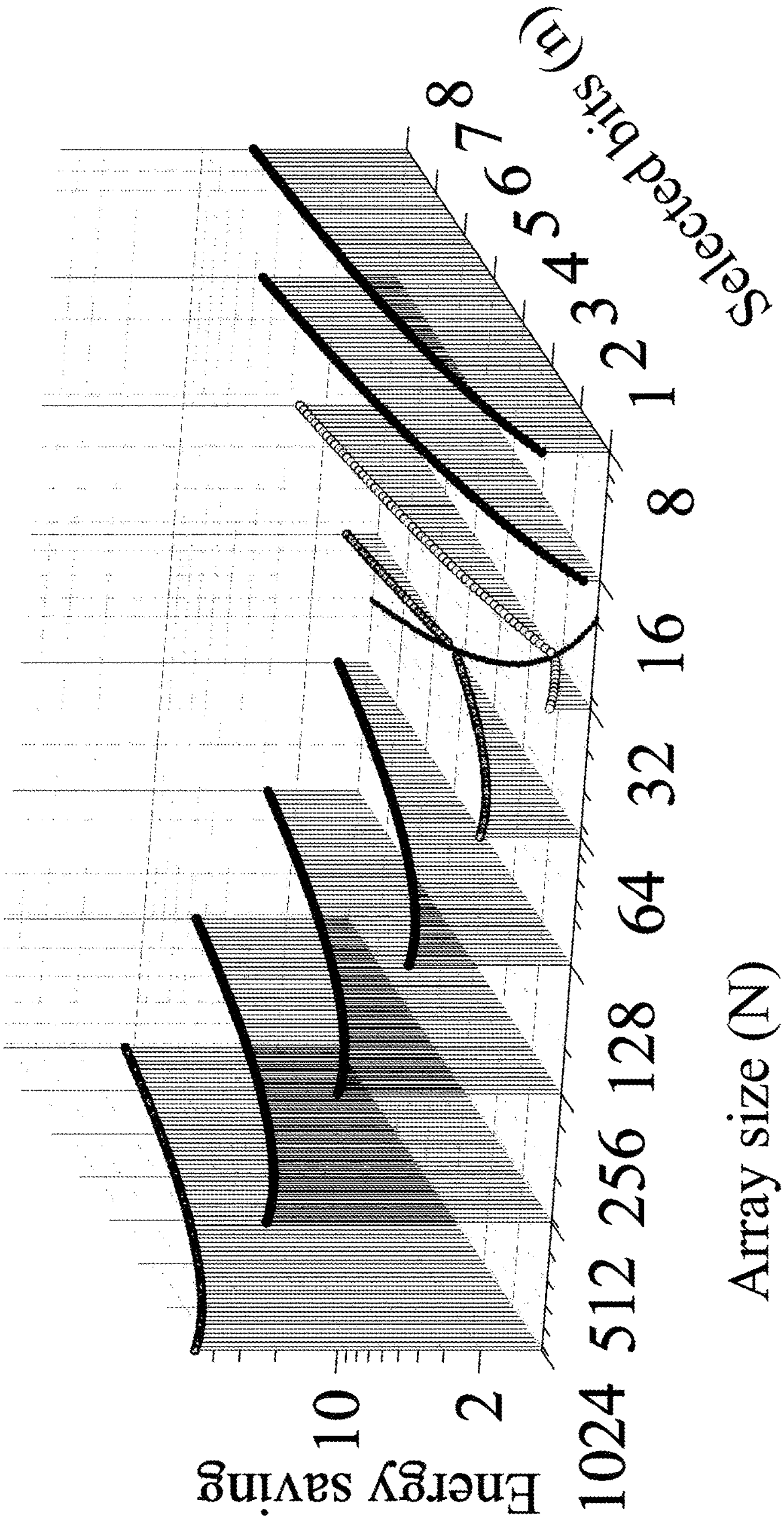
FIG. 12C is a 3D bar and curve graph illustrating energy savings for different array sizes and number of selected cells considering $K_r$=345/50.

The effect of N and $K_r$ on the energy savings is shown in FIG. 12A, FIG. 12B, and FIG. 12C. FIG. 12A is a 3D bar and curve graph illustrating energy savings for different array sizes and number of selected cells considering $K_r$=1000/20. FIG. 12B is a 3D bar and curve graph illustrating energy savings for different array sizes and number of selected cells considering $K_r$=345/20. FIG. 12C is a 3D bar and curve graph illustrating energy savings for different array sizes and number of selected cells considering $K_r$=345/50. Note that the hybrid bias scheme only benefits specific array sizes for a fixed value of $K_r$. For instance, according to FIG. 12A, FIG. 12B, and FIG. 12C, the hybrid bias scheme can be used for an array size of, respectively, 512×512 or 256×256, 128×128 (same as shown in FIG. 11), and 64×64. The curve along the N and n axes spans the regions where no energy savings exist (i.e., unity). If the array size is above this curve, the bias scheme is set to V/2. If below this curve, the bias scheme is set to V/3. If the array size is neither above nor below this curve, the hybrid bias scheme can be used to improve the energy efficiency.

By setting the energy for both bias schemes, (eq. 3) and (eq. 4), equal, the number of bits in which both bias schemes consume the same energy $n_{th}$ can be determined. Based on this equality, $n_{th}$ is $$n_{th} = \frac{2N^2 - 3K_rN}{3K_rN - 6K_r + 2} \quad \text{(equation 7)}$$

where $K_r$ is the ratio of the nonlinearity factors, $$K_r = \frac{K_{V/3}}{K_{V/2}} \quad \text{(equation 8)}$$

Figure 13:
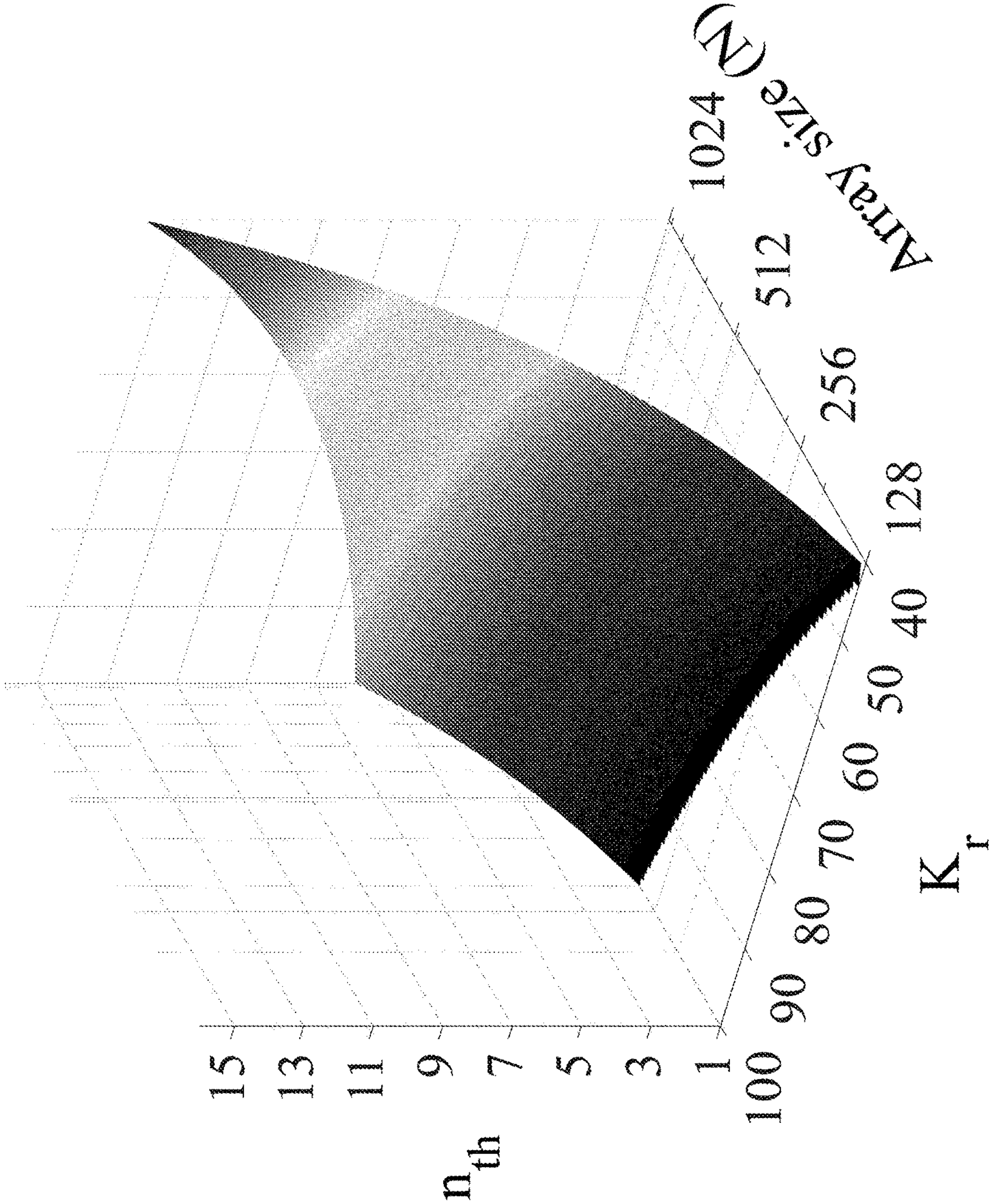
FIG. 13 is a 3D contour plot showing a number of selected cell in which the energy for both bias schemes are equal with respect to $K_r$ and the array size N.

Note that $n_{th}$ is a function of $K_r$ and the array size N when the interconnect resistance is negligible. The change of $n_{th}$ as a function of $K_r$ and the array size N are shown in FIG. 13. FIG. 13 is a 3D contour plot showing a number of selected cell in which the energy for both bias schemes are equal with respect to $K_r$ and the array size N. For large arrays with low $K_r$, $n_{th}$ increases significantly, reaching 16. This effect is due to the diminishing savings in energy of the V/3 bias scheme with increasing array size, resulting in a large number of unselected cells leaking current, which scales with $N^2$. Furthermore, a lower $K_r$ means the difference in leakage current between the half-selected cells for both bias scheme decreases. Thus, the V/2 bias scheme is more energy efficient for a wider number of selected cells. Because the leakage current of the unselected cells for the V/3 bias scheme decreases relative to the leakage current of the V/2 bias scheme, as $K_r$ increases, the V/3 bias scheme becomes more energy efficient for a wider number of selected cells, hence decreasing $n_{th}$. In addition, if the interconnect resistance incurs significant IR voltage loss, $n_{th}$ decreases since the switching time for the V/2 bias scheme is larger than the V/3 bias scheme due to the voltage degradation across the selected cells [1]. Increasing $K_r$ from a few tens to 100 can reduce $n_{th}$ from 16 to six. If $n_{th}$ is larger or equal to the maximum number of selected cells (i.e., word size), the array is biased with only the V/2 bias scheme rather than the hybrid bias scheme (see FIG. 11). The nonlinearity factor of a 1S1R cell for the V/2 bias scheme is typically less than 100 whereas the nonlinearity factor for the V/3 bias scheme reaches a few thousands. $K_r$ is typically in the range of a few tens to several hundreds.

Part 4.2—Overhead

While the V/2 bias scheme uses two voltages, $V_{write}$ and $V_{write}/2$, the $V_{write}/3$ bias scheme uses three voltages, namely, $V_{write}$, $V_{write}/3$, and $2V_{write}/3$, a hybrid solution using both bias schemes, uses four voltage levels. Providing a large number of heterogeneous on-chip voltages can be challenging due to the limited board area for the off-chip power supplies and the limited number of power I/Os. In [3], a boost converter with a charge pump is used to bias the array. This boost converter approach is less feasible for a hybrid bias scheme with multiple voltage levels because the switching converter requires large off-chip inductors as well as large capacitors, greatly increasing the area and therefore the cost [34]. Linear regulators, alternatively, are less power efficient as opposed to switching converters; however, linear converters are much smaller since bulky capacitors or inductors are not required [16]. Heterogeneous power delivery systems with a large number of voltages using on-chip linear regulators have been described [15A, 15B, 30]. These on-chip voltage regulators can be placed close to the load, further reducing the response time while providing fast local power management to control the bias scheme (as opposed to an off-chip power management solution which exhibits higher latency) [22]. Programming of the on-chip regulators has been described, for example, by references [20, 22].

As described hereinabove, by programming the reference voltage of the on-chip regulators, we realized a new bias scheme for an energy efficient write scheme for non-volatile resistive crossbar arrays with selectors where the bias can be dynamically altered between V/2 and V/3 responsive to a number of selected cells during a write operation.

The energy efficient write scheme described by this Application provides energy savings as high as 2.5× as compared to a conventional system with a single bias scheme. The write process however incurs additional steps as compared to a conventional write operation with a constant bias scheme (See FIG. 10), increasing the write latency. The write latency is typically the switching time of the 1S1R cell. In the described hybrid write scheme, however, the read-before-write operation adds a read operation for every write operation. The time used to compute and compare n with respect to $n_{th}$ should be considered in addition to the switching time of the 1S1R cell.

In memory systems, the read operation is typically a primary performance bottleneck. If, however the write latency increases significantly, it can inhibit memory performance. Thus, a fast power delivery system is should be used for time constrained memory applications such as DRAM and cache memory. For slower memory systems, such as flash, the stringent timing requirements can be relaxed. While the read latency is significantly smaller than the write latency [17] and can be as low as five nanoseconds [31], the time required to program the voltage regulators has to be within a few nanoseconds to prevent write dependent performance limitations. Hence, on-chip voltage regulator (as opposed to an off-chip regulator) should be used, because unlike on-chip local regulation, off-chip power management and regulation cannot provide sub-μs bandwidth [22].

The energy overhead of the energy efficient write scheme is insignificant. The write operation for a 1S1R crossbar array is typically on the orders of hundreds of nanojoules [17]. The read operation during the read-before-write requires negligible energy, typically less than one nanojoule since the read latency is significantly less than the write latency. The programmable CMOS reference voltage consumes a few picojoules [21], assuming a switching time on the order of hundreds of nanoseconds. Further lowering of the overhead of the write latency in time constrained memory applications can improve the write scheme of the Application.

Figure 14:
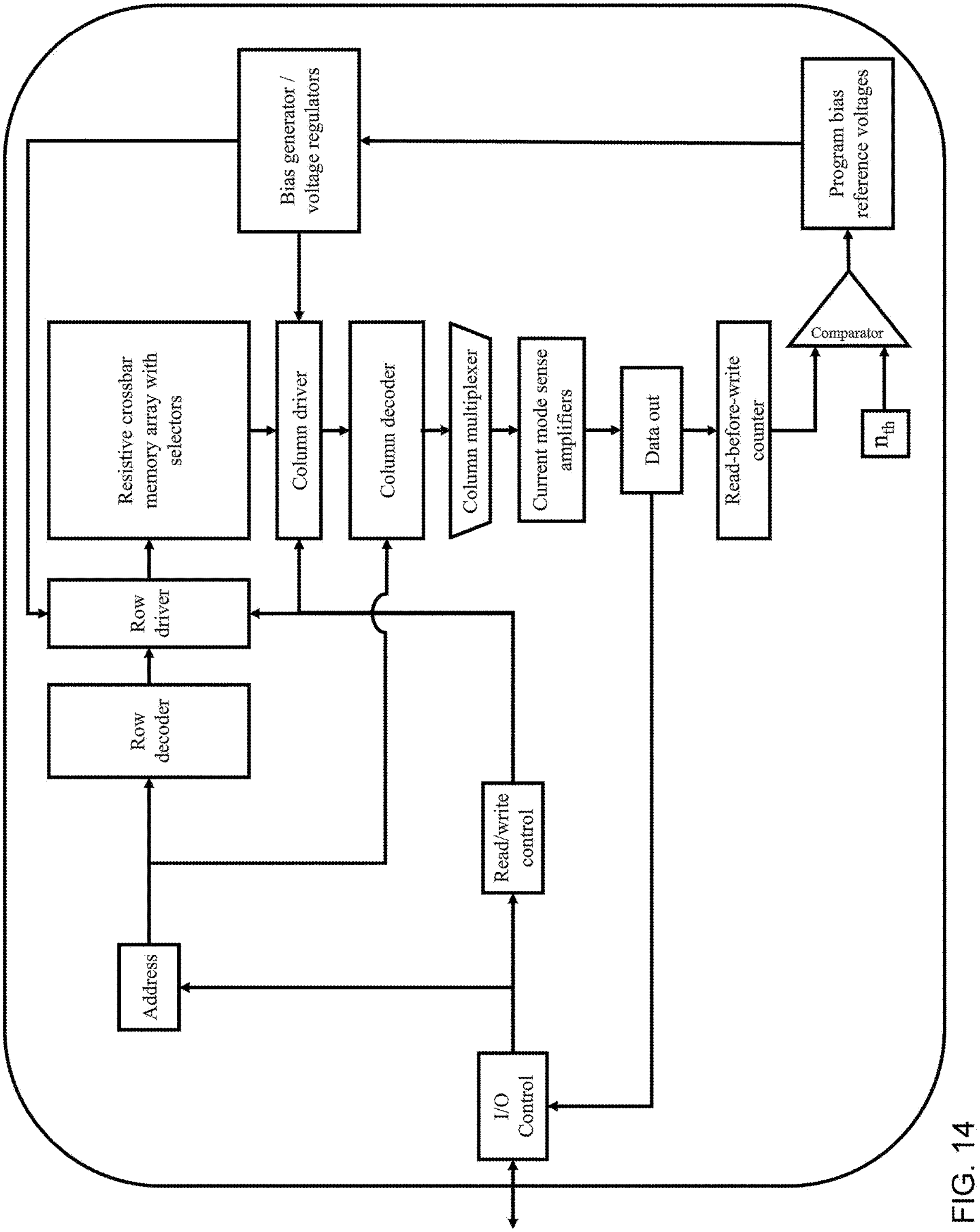
FIG. 14 is a block diagram showing an exemplary non-volatile resistive crossbar array with selectors according to the energy efficient write scheme of the Application.

FIG. 14 is a block diagram showing an exemplary non-volatile resistive crossbar array 1400 with selectors according to the energy efficient write scheme of the Application.

Figure 15:
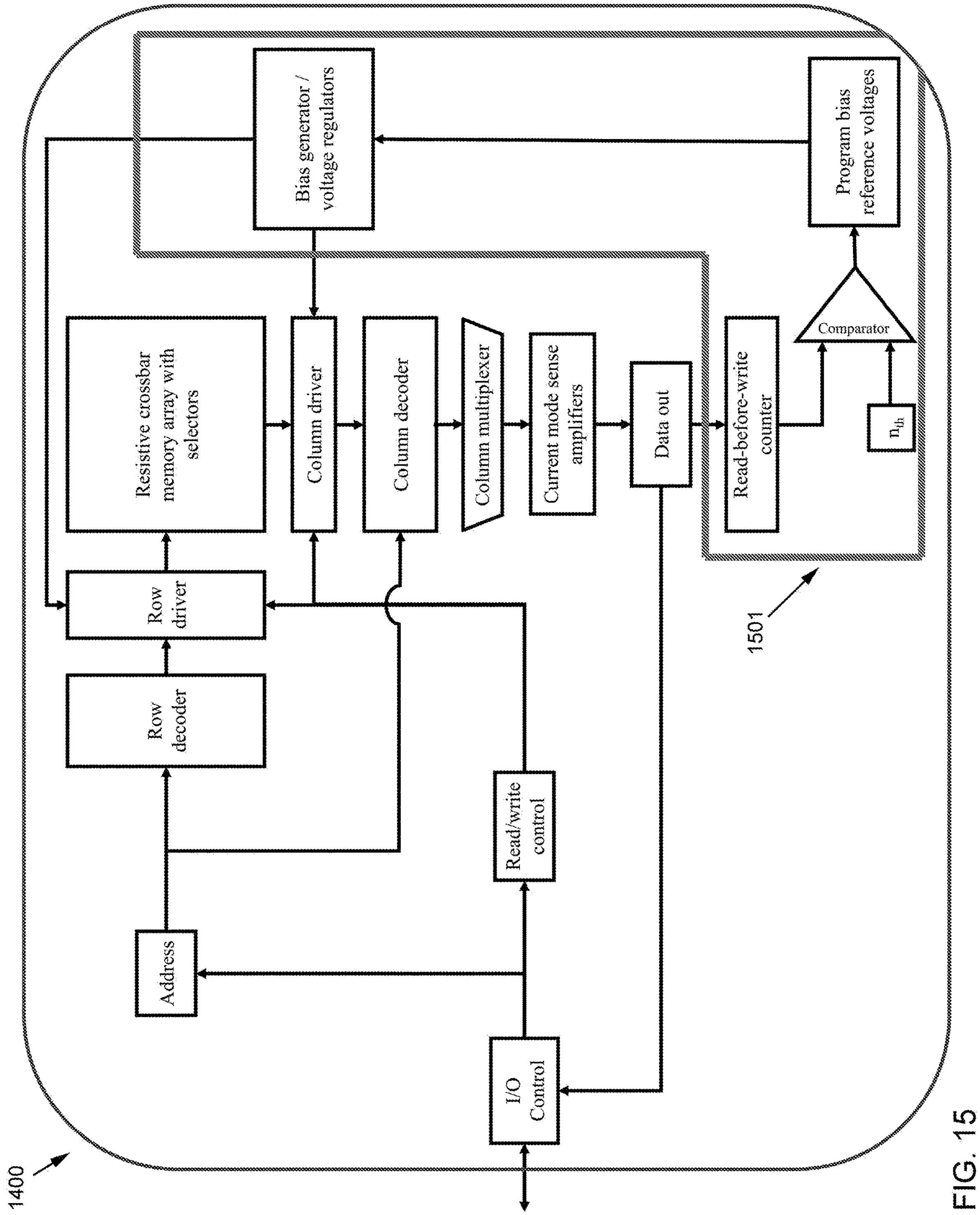
FIG. 15 is the block diagram of the resistive crossbar array 1400 of FIG. 14 indicating the group of blocks which have been added to a conventional crossbar array to perform the process of the Application.

FIG. 15 is the block diagram of the resistive crossbar array 1400 of FIG. 14 highlighting a group of blocks 1501 which have been added to a conventional crossbar array to perform the process of the Application. The group of blocks 1501 include new structure where the output data from the sense amplifiers are sampled, compared to $n_{th}$ and used to tune the bias generators. The blocks outside of the new group of blocks 1501, such as including various row and column decoders and drivers, operate in a conventional matter as will be well understood by those skilled in the art.

Figure 16:
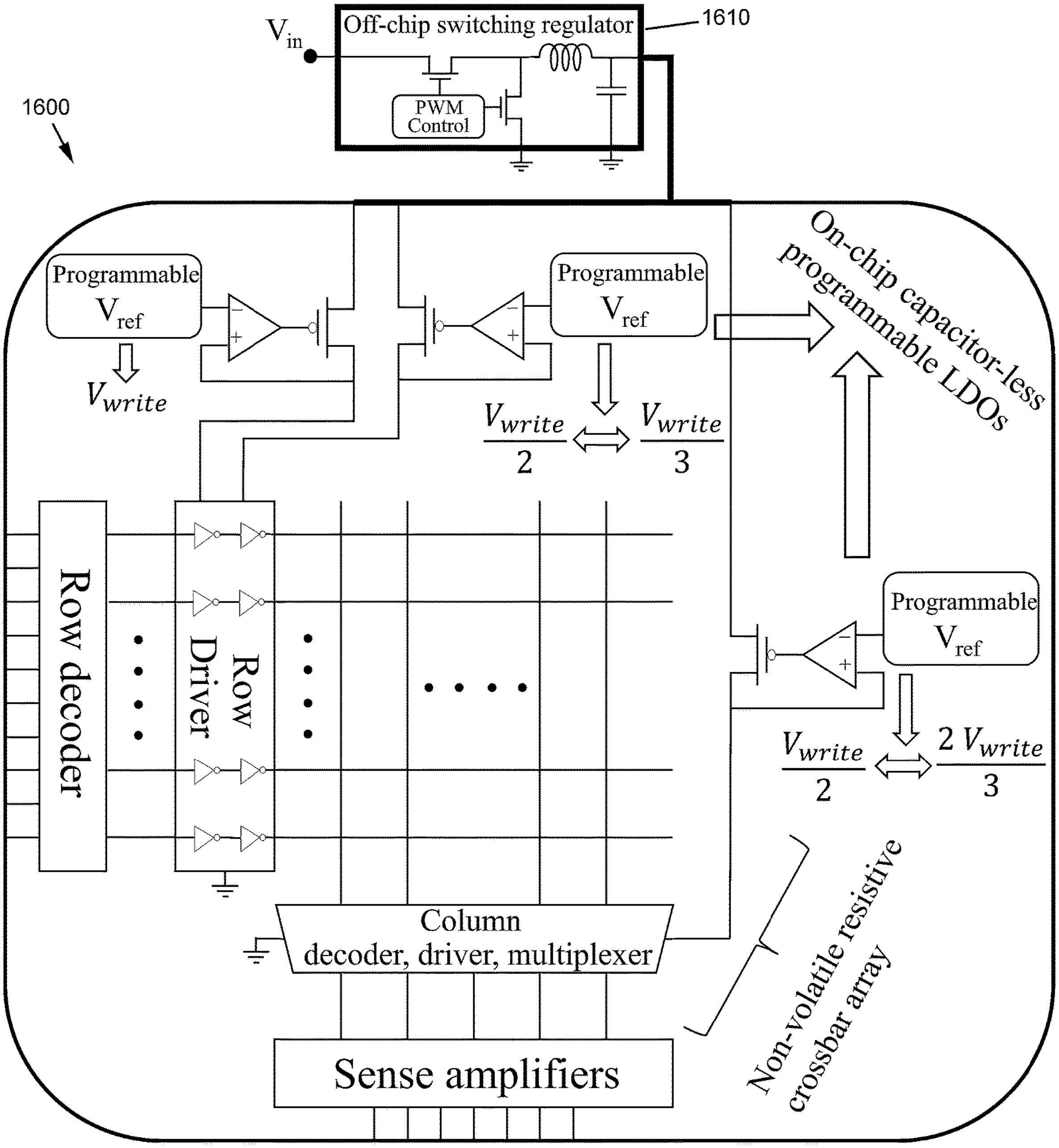
FIG. 16 is a schematic diagram exemplary non-volatile resistive crossbar array with selectors according to the energy efficient write scheme of the Application.

FIG. 16 is a schematic diagram exemplary non-volatile resistive crossbar array 1600 with selectors according to the energy efficient write scheme of the Application. Another improvement includes the use of on-chip capacitor-less programmable low drop out linear regulators (LDO). The non-volatile resistive crossbar array 1600 is powered by an off-chip switching regulator 1610.

other types of bias generators—The exemplary crossbar arrays of the application generally use fully integrated LDOs with tunable output voltages. However, any suitable settable voltage source or regulator can be used as the bias generator. Because of the switching speeds used, typically the settable or tunable voltage source or voltage regulator will be disposed on-chip, such as in a fully integrated on-chip structure.

Part 5—Conclusion

The energy consumption of a 1S1R crossbar array for two bias schemes, V/2 and V/3, for optimal energy efficiency has been described hereinabove. Closed-form expressions that intuitively model the energy consumption in terms of the nonlinearity factor, size of the array, and number of selected cells have also been described. The most energy efficient bias schemes depend upon the size of the array as well as the number of selected cells during a write operation. The energy consumed during both the V/2 bias scheme bias schemes and the V/3 bias scheme scale differently. The V/2 bias scheme is more energy efficient for large arrays. As the number of selected cells increases, however, the V/3 bias scheme achieves greater energy efficiency. The V/3 bias scheme provides higher efficiency, decreasing the energy consumption by an order of magnitude for a 64×64 array with eight selected cells. As the array size increases and the number of selected cells decreases, the energy benefits of the V/3 bias scheme diminish.

For the V/3 bias scheme to be as energy efficient as the V/2 bias scheme for large arrays (N>128), $K_{V/3}$ should be two orders of magnitude greater than $K_{V/2}$. The appropriate choice of bias scheme can save an order of magnitude of energy. A higher nonlinearity factor significantly decreases the energy consumption by suppressing leakage currents within the half-selected and unselected cells. The switching energy is a negligible portion of the total energy for large arrays (N>128). To prevent excess energy consumption due to leakage currents, write termination circuitry can be used to prevent over extended write pulses.

An energy efficient write scheme has been described to improve the energy efficiency during write operations. The exemplary write operation uses a hybrid bias scheme to exploit both the V/2 and V/3 bias schemes to enhance the energy efficiency based on the number of selected cells. The number of selected cells in which the bias scheme switches ($n_{th}$) has been described and characterized. Energy improvements provided by the hybrid write scheme can be at least as high as 2.5×. To effectively exploit the energy efficient write scheme in time constrained memory systems, the program time of the voltage regulators and the time to compute $n_{th}$ should be on the order of a few nanoseconds. The described write scheme incurs negligible energy overhead.

APPENDIX

To estimate the switching energy of a resistive cell, the resistance is modeled as a linear function during the switching interval. The resistance during a set operation is $$R(t) = R_{off} + \frac{t}{t_{set}}(R_{on} - R_{off}) \quad \text{(equation 9)}$$

assuming the set operation is initiated between t=0 and $t=t_{set}$. If the interconnect resistance is negligible, the voltage across the cell is equal to the write voltage $V_{write}$. The power consumption is $$P_{set}(t) = \frac{V_{write}^2}{R(t)} \quad \text{(equation 10)}$$

Integrating (10) over the set period, the energy consumption is $$E_{set} = \int_{t=0}^{t_{set}} P_{set}(t)dt = \frac{V_{write}^2}{R_{on} - R_{off}} \ln\left(\frac{R_{on}}{R_{off}}\right) t_{set} \quad \text{(equation 11)}$$

For a symmetric resistive cell where the set and reset voltages as well as switching times are equal, the set and reset energy consumption is also the same.

Other bias schemes—The Application has described in detail use automatic selection of the V/2 bias scheme and the V/3 bias scheme. However, those skilled in the art will understand that there can be other suitable bias schemes and that more generally applying the realization of the Application where the bias can be dynamically altered between V/2 and V/3 responsive to a number of selected cells during a write operation, the bias can be dynamically altered between a first bias scheme and a second bias scheme, responsive to a number of selected cells during a write operation. Also, there can be embodiments where there are more than two selectable bias schemes.

A non-volatile resistive crossbar array with selectors is typically a hardware structure, such as, for example an integrated circuit device. Modeling code, structure designs, integrated circuit designs and layouts, logic structure designs, regulator structure designs, crossbar structure designs, programmable logic structure and/or function designs can be stored and provided on a computer readable non-transitory storage medium. Any related firmware, and/or software can also be stored and provided on a computer readable non-transitory storage medium. A computer readable non-transitory storage medium as non-transitory data storage includes any data stored on any suitable media in a non-fleeting manner. Such data storage includes any suitable computer readable non-transitory storage medium, including, but not limited to hard drives, non-volatile RAM, SSD devices, CDs, DVDs, etc. To the extent that one or more processes are executed by a logic structure (with or without firmware or software), the logic structure is in and of itself, a non-transitory storage medium.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

REFERENCES

[1] A. Ciprut and E. G. Friedman, "Modeling Size Limitations of Resistive Crossbar Array With Cell Selectors," *IEEE Transactions on Very Large Scale Integration Systems*, Vol. 25, No. 1, pp. 286-293, January 2017.

[2] A. Ciprut and E. G. Friedman, "On the Write Energy of Non-Volatile Resistive Crossbar Arrays With Selectors," *Proceedings of the IEEE International Symposium on Quality Electronic Design*, March 2018 (in submission).

[3] T. Ishii, S. Ning, M. Tanaka, K. Tsurumi, and K. Takeuchi, "Adaptive Comparator Bias-Current Control of 0.6 V Input Boost Converter for ReRAM Program Voltages in Low Power Embedded Applications," *IEEE Journal of Solid-State Circuits*, Vol. 51, No. 10, pp. 2389-2397, October 2016.

[4] Y.-C. Chen, et al., "An Access-Transistor-Free (0T/1R) Non-Volatile Resistance Random Access Memory (RRAM) Using a Novel Threshold Switching, Self-Rectifying Chalcogenide Device," *Proceedings of the IEEE International Electron Devices Meeting*, pp. 4-37, December 2003.

[5] J.-J. Huang, Y.-M. Tseng, C.-W. Hsu, and T.-H. Hou, "Bipolar Nonlinear Ni/TiO2/Ni Selector for 1S1R Crossbar Array Applications," *IEEE Electron Device Letters*, Vol. 32, No. 10, pp. 1427-1429, October 2011.

[6] R. Midya, et al., "Anatomy of Ag/Hafnia-Based Selectors with 1010 Nonlinearity," *Advanced Materials*, Vol. 29, No. 12, pp. 1-8, January 2017.

[7] W. Lee, et al., "High Current Density and Nonlinearity Combination of Selection Device Based on TaOx/TiO2/TaOx Structure for One Selector One Resistor Arrays," *ACS Nano*, Vol. 6, No. 9, pp. 8166-8172, August 2012.

[8] J.-J. Huang, Y.-M. Tseng, W.-C. Luo, C.-W. Hsu, and T.-H. Hou, "One Selector-One Resistor (1S1R) Crossbar Array for High-Density Flexible Memory Applications," *Proceedings of the IEEE International Electron Device Meeting*, pp. 31.7.1-31.7.4, December 2011.

[9] Q. Luo, et al., "Demonstration of 3D Vertical RRAM with Ultra Low-Leakage, High-Selectivity and Self-Compliance Memory Cells," *Proceedings of the IEEE International Electron Device Meeting*, pp. 10.2.1-10.2.4, December 2015.

[10] M. Wang, J. Zhou, Y. Yang, S. Gaba, M. Liu, and W. D. Lu, "Conduction Mechanism of a TaOx-Based Selector and its Application in Crossbar Memory Arrays," *Nanoscale, Vol.* 7, No. 11, pp. 4964-4970, February 2015.

[11] B. J. Choi, et al., "Trilayer Tunnel Selectors for Memristor Memory Cells," *Advanced Materials*, Vol. 28, No. 2, pp. 356-362, January 2016.

[12] C.-Y. Lin, et al., "Attaining Resistive Switching Characteristics and Selector Properties By Varying Forming Polarities In A Single HfO2-Based RRAM Device With A Vanadium Electrode," *Nanoscale*, Vol. 9, pp. 8586-8590, May 2017.

[13] Q. Luo, et al., "Super Non-Linear RRAM With Ultra-Low Power for 3D Vertical Nano-Crossbar Arrays," *Nanoscale*, Vol. 8, pp. 15629-15636, July 2016.

[14] D. B. Strukov, G. S. Snider, D. R. Stewart, and R. S. Williams, "The Missing Memristor Found," *Nature*, Vol. 453, No. 7191, pp. 80-83, May 2008.

[15A] I. Vaisband and E. G. Friedman, "Heterogeneous Methodology for Energy Efficient Distribution of On- Chip Power Supplies," *IEEE Transactions on Power Electronics*, Vol. 28, No. 9, pp. 4267-4280, September 2013.

[15B] U.S. Pat. No. 9,785,161, Heterogeneous method for energy efficient distribution of on-chip power supplies and power network on-chip system for scalable power delivery, issued Oct. 10, 2017 to Vaisband, et. al. The '161 patent is incorporated herein by reference in its entirety for all purposes.

[16] J. Torres, et al., "Low Drop-Out Voltage Regulators: Capacitor-Less Architecture Comparison," *IEEE Circuits and Systems Magazine*, Vol. 14, No. 2, pp. 6-26, May 2014.

[17] D. Xiangyu, C. Xu, Y. Xie, and N. P. Jouppi, "NVSim: A Circuit-Level Performance, Energy, and Area Model for Emerging Nonvolatile Memory," *IEEE Transactions on Computer-Aided Design of Integrated Circuits and Systems*, Vol. 31, No. 7, pp. 994-1007, July 2012.

[18] X. Cong, et al., "Overcoming the Challenges of Crossbar Resistive Memory Architectures," *Proceedings of the IEEE International Symposium on High Performance Computer Architecture*, pp. 476-488, February 2015.

[19] H. S. P. Wong, et al., "Phase Change Memory," *Proceedings of the IEEE*, Vol. 98, No. 12, pp. 2201-2227, October 2010.

[20] Y.-C. Wu, C.-Y. Huang, and B.-D. Liu, "A Low Dropout Voltage Regulator with Programmable Output," *Proceedings of the IEEE Conference on Industrial Electronics and Applications*, pp. 3357-3361, June 2009.

[21] V. Srinivasan, G. Serrano, C. M. Twigg, and P. Hasler, "A Floating-Gate-Based Programmable CMOS Reference," *IEEE Transactions on Circuits and Systems I: Regular Papers*, Vol. 55, No. 11, pp. 3448-3456, December 2008.

[22] Z. Toprak-Deniz, et al., "Distributed System of Digitally Controlled Microregulators Enabling Per-Core DVFS for the POWER8™ Microprocessor," *Proceedings of the IEEE International Solid-State Circuits Conference*, pp. 98-99, February 2014.

[23] H. L. Lung, "Method, Apparatus and Computer Program Product for Read Before Programming Process on Multiple Programmable Resistive Memory Cell," U.S. Pat. No. 7,433,226, Oct. 7, 2008.

[24] H. S. P. Wong, et al., "Metal-Oxide RRAM," *Proceedings of the IEEE*, Vol. 100, No. 6, pp. 1951-1970, May 2012.

[25] S. Yu and P.-Y. Chen, "Emerging Memory Technologies: Recent Trends and Prospects," *IEEE Solid-State Circuits Magazine*, Vol. 8, No. 2, pp. 43-56, June 2016.

[26] S. Yu, *Resistive Random Access Memory (RRAM) From Devices to Array Architectures*. Morgan & Claypool, 2016.

[27] A. Chen, "A Review of Emerging Non-Volatile Memory (NVM) Technologies and Applications," *Solid-State Electronics*, Vol. 125, pp. 25-38, November 2016.

[28] B. Song, Q. Li, H. Liu, and H. Liu, "Exploration of Selector Characteristic Based On Electron Tunneling for RRAM Array Application," *IEICE Electronics Express*, Vol. 14, No. 17, pp. 1-8, August 2017.

[29] R. Aluguri and T.-Y. Tseng, "Overview of Selector Devices for 3-D Stackable Cross Point RRAM Arrays," *IEEE Journal of the Electron Devices Society*, Vol. 4, No. 5, pp. 294-306, September 2016.

[30] S. Kose and E. G. Friedman, "Distributed On-Chip Power Delivery," *IEEE Journal on Emerging and Selected Topics in Circuits and Systems*, Vol. 2, No. 4, pp. 704-713, December 2012.

[31] T. Na, B. Song, J. P. Kim, S. H. Kang, and S.-O. Jung, "Offset-Canceling Current-Sampling Sense Amplifier for Resistive Nonvolatile Memory in 65 nm CMOS," *IEEE Journal of Solid-State Circuits*, Vol. 52, No. 2, pp. 496-504, February 2017.

[32] S. Kvatinsky, G. Satat, N. Wald, E. G. Friedman, A. Kolodny, and U. C. Weiser, "Memristor-Based Material Implication (IMPLY) Logic: Design Principles and Methodologies," *IEEE Transactions on Very Large Scale Integration Systems*, Vol. 22, No. 10, pp. 2054-2066, October 2014.

[33] C. Yong, et al., "Nanoscale Molecular-Switch Crossbar Circuits," *Nanotechnology*, Vol. 14, No. 4, pp. 462-468, March 2003.

[34] G. Villar-Pique, H. J. Bergveld, and E. Alarcon, "Survey and Benchmark of Fully Integrated Switching Power Converters: Switched-Capacitor Versus Inductive Approach," *IEEE Transactions on Very Large Scale Integration Systems*, Vol. 28, No. 9, pp. 4156-4167, September 2013.

[35] H. Farkhani, M. Tohidi, A. Peiravi, J. K. Madsen, and F. Moradi, "STT-RAM Energy Reduction Using Self-Referenced Differential Write Termination Technique," *IEEE Transactions on Very Large Scale Integration Systems*, Vol. 25, No. 2, pp. 476-487, February 2017.

[36] S. Kvatinsky, M. Ramadan, E. G. Friedman, and A. Kolodny, "VTEAM: A General Model for Voltage-Controlled Memristors," *IEEE Transactions on Circuits and Systems II: Express Briefs*, Vol. 62, No. 8, pp. 786-790, August 2015.

What is claimed is:

1. A method to adaptively and dynamically set a bias scheme of a crossbar array for a write operation comprising:

performing a read-before-write operation to determine a number of cells n to be written during a write operation;

comparing n to a predetermined threshold value $n_{th}$ to determine an efficient bias scheme;

setting at least one voltage regulator to provide a bias voltage according to said efficient bias scheme; and performing said write operation.

2. The method of claim 1, wherein said step of comparing n to a predetermined threshold value $n_{th}$ to determine an efficient bias scheme comprises a first bias scheme where $n<n_{th}$, and a second bias scheme where $n>n_{th}$.

3. The method of claim 2, wherein said first bias scheme comprises a V/2 bias.

4. The method of claim 2, wherein said second bias scheme comprises a V/3 bias.

5. The method of claim 1, wherein said step of running a read-before-write operation comprises counting a number of cells that will switch during said write operation.

6. The method of claim 1, wherein said write operation comprises executing a write pulse.

7. The method of claim 1, wherein said step of setting at least one voltage regulator comprises setting a tunable linear regulator.

8. The method of claim 7, wherein said step of setting at least one voltage regulator comprises setting a capacitor-less regulator.

9. The method of claim 1, wherein a crossbar array integrated circuit comprises an on-chip integrated logic section to run said method.

10. A method to determine threshold value $n_{th}$ to determine an efficient bias scheme of a crossbar array comprising:

providing an array size and ratio of a non-linearity factor of a crossbar array; and based on said array size and said ratio of a non-linearity factor, determining a threshold value $n_{th}$ where at least two different bias schemes exhibit substantially a same energy use for write operations.

11. The method of claim 10, wherein said step of determining a threshold value comprises a non-linearity factor defined by an equation:

$$K_r = \frac{K_{V/3}}{K_{V/2}},$$

where $K_{V/3}$ is a non-linearity factor for a V/3 bias scheme and $K_{V/2}$ is a non-linearity factor for a V/2 bias scheme.

12. The method of claim 11, said step of determining a threshold value comprises an equation:

$$K_{V/2} = \frac{I_{cell}(V_{write})}{I_{cell}(V_{write}/2)} = 2 \times \frac{R_{on@V_{write}/2}}{R_{on}}, \text{ and}$$

$$K_{V/3} = \frac{I_{cell}(V_{write})}{I_{cell}(V_{write}/3)} = 3 \times \frac{R_{on@V_{write}/3}}{R_{on}}$$

where $I_{cell}(V_{write})$, $I_{cell}(V_{write}/2)$, and $I_{cell}(V_{write}/3)$ are, respectively, a current passing through a cell when a cell voltage is equal to a write voltage, one half of a write voltage, and one third of a write voltage, and $R_{on}$, $R_{on@V_{write}/2}$, and $R_{on@V_{write}/3}$ are, respectively, a cell resistance during an on-state when a cell voltage is equal to a write voltage, one half of a write voltage, and one third of a write voltage.

13. The method of claim 10, said step of determining a threshold value comprises an equation:

$$n_{th} = \frac{2N^2 - 3K_rN}{3K_rN - 6K_r + 2}, \text{ where } K_r = \frac{K_{V/3}}{K_{V/2}},$$

and N is the array size.

14. An energy efficient crossbar array device comprising:

an integrated crossbar array with an I/O control, read/write control, row and column decoders and drivers, and a data port;

a read-before-write counter coupled to said data port, said read-before-write counter also coupled to a first input port of a comparator, a second input port of said comparator having as input, a predetermined threshold value;

a program bias reference logic element coupled to an output of said comparator;

at least one settable bias generator or tunable voltage regulator coupled to said program bias reference logic element, said at least one settable bias generator or tunable voltage regulator to provide a bias voltage according to a bias scheme to at least one driver; and wherein said bias voltage is dynamically altered between at least a first bias scheme and a second bias scheme, responsive to a number of selected cells n during a write operation in comparison with said predetermined threshold value.

15. The energy efficient crossbar array device of claim 14, wherein said first bias scheme comprises a V/2 bias scheme.

16. The energy efficient crossbar array device of claim 14, wherein said second bias scheme comprises a V/3 bias scheme.

17. The energy efficient crossbar array device of claim 14, wherein said integrated crossbar array comprises a non-volatile resistive crossbar array.

18. The energy efficient crossbar array device of claim 14, wherein said at least one settable bias generator or tunable voltage regulator comprises an integrated linear regulator.

19. The energy efficient crossbar array device of claim 18, wherein said integrated linear regulator comprises a capacitor-less regulator.

* * * * *